United States Patent
Lim et al.

(10) Patent No.: US 8,912,592 B2
(45) Date of Patent: Dec. 16, 2014

(54) NON-VOLATILE MEMORY DEVICE INCLUDING ETCH STOP LAYER PATTERN

(71) Applicants: Jong-heun Lim, Hwaseong-si (KR); Ki-ho Bae, Seoul (KR); Hyo-jung Kim, Seoul (KR); Kyung-hyun Kim, Seoul (KR); Chan-wook Seo, Hwaseong-si (KR); Young-beom Pyon, Suwon-si (KR)

(72) Inventors: Jong-heun Lim, Hwaseong-si (KR); Ki-ho Bae, Seoul (KR); Hyo-jung Kim, Seoul (KR); Kyung-hyun Kim, Seoul (KR); Chan-wook Seo, Hwaseong-si (KR); Young-beom Pyon, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/668,854

(22) Filed: Nov. 5, 2012

(65) Prior Publication Data

US 2013/0214344 A1 Aug. 22, 2013

(30) Foreign Application Priority Data

Feb. 22, 2012 (KR) ........................ 10-2012-0018055

(51) Int. Cl.
*H01L 29/792* (2006.01)
*H01L 27/115* (2006.01)

(52) U.S. Cl.
CPC ........ *H01L 29/792* (2013.01); *H01L 27/11582* (2013.01)
USPC ................... 257/324; 257/326; 257/E27.103; 257/E21.645; 438/264

(58) Field of Classification Search
None
See application file for complete search history.

(56) References Cited

U.S. PATENT DOCUMENTS

| | | | |
|---|---|---|---|
| 6,300,683 | B1 | 10/2001 | Nagasaka et al. |
| 7,205,223 | B2 | 4/2007 | McTeer |
| 2009/0179257 | A1 | 7/2009 | Komori et al. |
| 2011/0090737 | A1 | 4/2011 | Yoo et al. |
| 2012/0077320 | A1* | 3/2012 | Shim et al. ............ 438/269 |
| 2012/0098050 | A1* | 4/2012 | Shim et al. ............ 257/324 |

FOREIGN PATENT DOCUMENTS

| | | |
|---|---|---|
| JP | 11-097651 A | 4/1999 |
| JP | 2005-252306 A | 9/2005 |
| JP | 2009-164433 A | 7/2009 |
| KR | 1999-0086181 A | 12/1999 |
| KR | 100305017 B1 | 7/2001 |
| KR | 2011-0042526 A | 4/2011 |
| WO | WO-01-78141 A2 | 10/2001 |

* cited by examiner

*Primary Examiner* — Julio J Maldonado
*Assistant Examiner* — Molly Reida
(74) *Attorney, Agent, or Firm* — Harness, Dickey & Pierce, P.L.C.

(57) ABSTRACT

According to example embodiments of inventive concepts, a non-volatile memory device includes a substrate including a second impurity region crossing a first impurity region, and channel regions extending in a vertical direction on the substrate. Gate electrodes may be separated from each other in a vertical direction and a horizontal direction along outer walls of the channel regions. A first insulating interlayer may be on the gate electrodes and the channel regions, where the first insulating interlayer defines a contact hole between at least one adjacent pair gate electrodes and a contact plug is formed in the contact hole to be electrically connected to the second impurity region. An etch stop layer pattern may be on the contact plug and the first insulating interlayer.

20 Claims, 20 Drawing Sheets

NON-VOLATILE MEMORY DEVICE INCLUDING ETCH STOP LAYER PATTERN

CROSS-REFERENCE TO RELATED APPLICATIONS

This application claims the benefit of Korean Patent Application No. 10-2012-0018055, filed on Feb. 22, 2012, in the Korean Intellectual Property Office, the disclosure of which is incorporated herein in its entirety by reference.

BACKGROUND

Example embodiments of inventive concepts relate to a non-volatile memory device and a method of manufacturing the non-volatile memory device, and more particularly, to a non-volatile memory device having a vertical structure and a method of manufacturing the non-volatile memory device.

As integrity of a memory device increases, a memory device having a vertical transistor structure has been suggested instead of a conventional memory device having a planar transistor structure.

SUMMARY

Example embodiments of inventive concepts relate to a non-volatile memory device having improved reliability.

Example embodiments of inventive concepts also relate to a method of manufacturing a non-volatile memory device having improved reliability.

According to embodiments of inventive concepts, a non-volatile memory device includes: a substrate including a first impurity region and a second impurity region, the second impurity region crossing the first impurity region; channel regions extending in a vertical direction on the substrate; gate electrodes separated from each other in a vertical direction and a horizontal direction along outer walls of the channel regions; a first insulating interlayer on the gate electrodes and the channel regions, the first insulating interlayer defining a contact hole between at least one adjacent pair of gate electrodes; a contact plug in the contact hole that is electrically connected to the second impurity region; and an etch stop layer pattern on the contact plug. The etch stop layer may contact the first insulating interlayer.

The etch stop layer pattern may contact a side wall of the first insulating interlayer that is exposed by the contact hole.

An upper surface of the contact plug may be lower than an upper surface of the first insulating interlayer.

The etch stop layer pattern may extend from an upper portion of the contact plug onto a side wall of the first insulating interlayer so as not to overlap with the gate electrodes.

A shape of the etch stop layer pattern may be a cup with an open bottom.

The etch stop layer pattern may extend from an upper portion of the contact plug onto an upper surface of the first insulating interlayer, and the etch stop layer pattern may overlap at least one of the gate electrodes.

The etch stop layer pattern may be formed on an entire surface of the first insulating interlayer, and may extend downward to an upper portion of the contact plug.

The non-volatile memory device may further include: a second insulating interlayer on the etch stop layer pattern and the first insulating interlayer; first plugs electrically connected to the channel regions by penetrating through at least one of the first insulating interlayers, the etch stop layer pattern, and the second insulating interlayer; a second plug electrically connected to the channel regions by penetrating through the second insulating interlayer; a bit line on the second insulating interlayer, the bit line electrically connected to the first plugs; and a common source line on the second insulating interlayer, the common source line electrically connected to the second plug.

The etch stop layer pattern may include a material having an etch selectivity with respect to the second insulating interlayer.

The second plug may penetrate through the etch stop layer pattern and the second insulating interlayer.

An upper surface of the contact plug may be coplanar with an upper surface of the first insulating interlayer. The etch stop layer pattern may be on the contact plugs and an entire surface of the first insulating interlayer, and the etch stop layer pattern may overlap with at least one of the gate electrodes.

According to example embodiments of inventive concepts, a non-volatile memory device includes: a substrate including a common source region and a common source line strapping region, the common source line strapping region crossing the common source region; channel regions extending in a vertical direction on the substrate; gate electrodes separated from each other in a vertical direction and a horizontal direction along outer walls of the channel regions; a first insulating interlayer on the gate electrodes and the channel regions, the first insulating interlayer defining a contact hole that exposes a portion of the common source line strapping region between an adjacent pair of the gate electrodes; a contact plug in the contact hole and electrically connected to the common source line strapping region; an etch stop layer pattern on the contact plug, the etch stop layer pattern contacting a part of the first insulating interlayer; and a second insulating interlayer on the first insulating interlayer and the etch stop layer pattern.

The etch stop layer pattern may contact a side wall of the first insulating interlayer that is exposed by the contact hole.

The etch stop layer pattern may extend from an upper portion of the contact plug onto an upper surface of the first insulating interlayer. The etch stop layer pattern may overlap with at least one of the gate electrodes.

According to example embodiments of inventive concepts, a non-volatile memory device includes: a substrate including a common source line strapping region intersecting at least one common source region; a plurality of memory strings extending vertically on the substrate; a contact plug between at least two of the plurality of memory strings, the contact plug on the common source line strapping region; a first insulating interlayer on the plurality of memory strings, the first insulating interlayer defining a contact hole that exposes the contact plug; and an etch stop layer pattern in the contact hole and on the contact plug.

The non-volatile memory device may further include a plurality of bit lines and a common source line, wherein each of the plurality of memory strings may be electrically connected to the common source line and one of the plurality of bit lines. Each of the plurality of memory strings may include a channel region extending vertically on the substrate, a plurality of gate electrodes spaced apart vertically on the substrate along at least one side wall of the channel region, and a gate dielectric layer between the plurality of gate electrodes and the channel region. The contact plug may be between the plurality of gate electrodes of the at least two of the plurality of memory strings.

A spacer layer may be between the contact plug and the at least two of the plurality of memory strings. The etch stop layer may be on at least one of the spacer layer and the first insulating interlayer.

A second insulating interlayer may be on the first insulating interlayer. The etch stop layer may extend between the first insulating interlayer and the second insulating interlayer.

The non-volatile memory device may further include a common source line, a plurality of bit lines, and a second insulating interlayer. The second insulating interlayer may be on the first insulating interlayer. Each of the plurality of memory strings may be electrically connected to the common source line and one the plurality of bit lines. The etch stop layer may contact at least one of an upper surface of the first insulating interlayer and a sidewall of the first insulating interlayer.

BRIEF DESCRIPTION OF THE DRAWINGS

Example embodiments of inventive concepts will be more clearly understood from the following detailed description taken in conjunction with the accompanying drawings in which.

DETAILED DESCRIPTION

Figure 1:
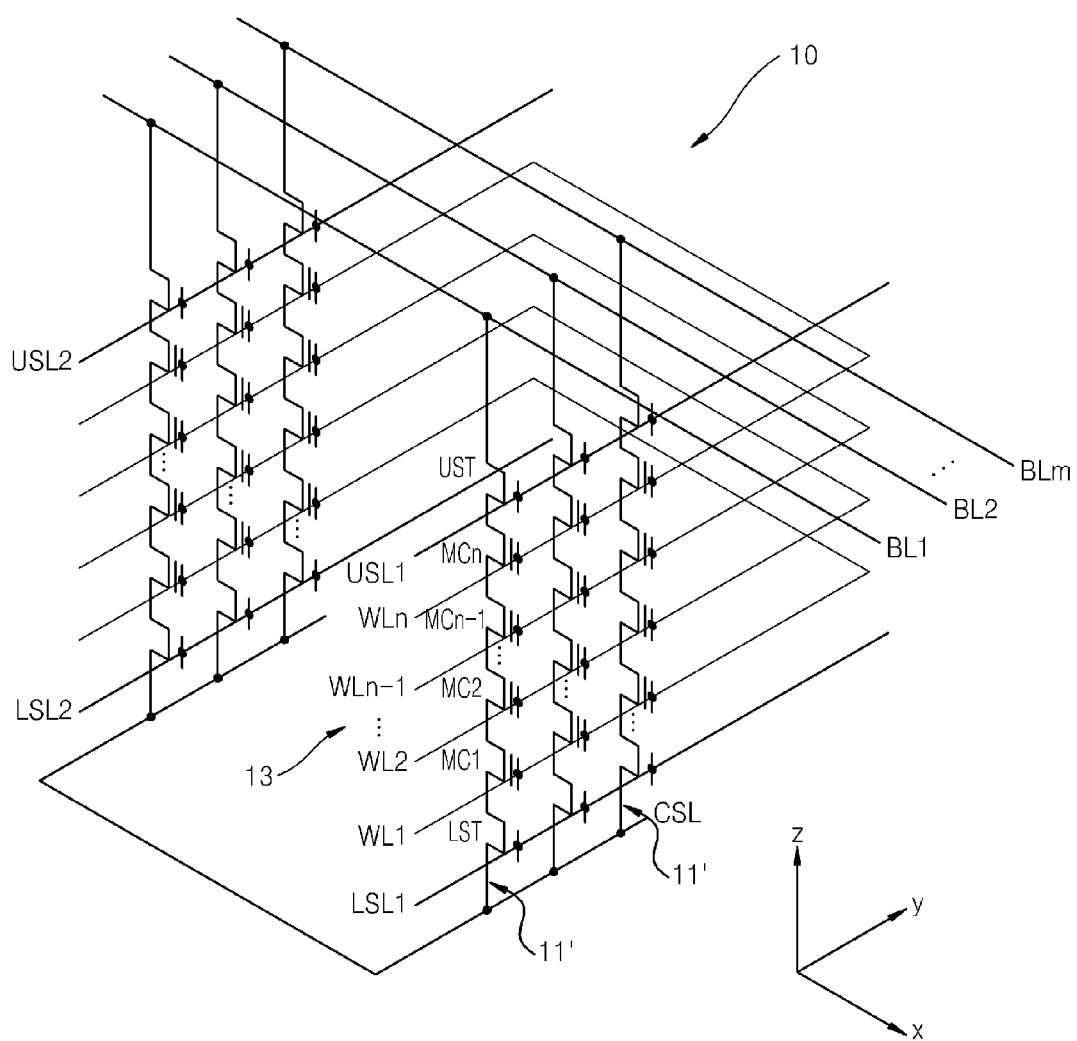
FIG. 1 is an equivalent circuit diagram of a memory cell array in a non-volatile memory device according to example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is an equivalent circuit diagram of a memory cell array 10 in a non-volatile memory device according to example embodiments of inventive concepts. FIG. 1 shows an equivalent circuit diagram of a NAND flash memory device of a vertical structure having a vertical channel structure as an example.

Referring to FIG. 1, the memory cell array 10 may include a plurality of memory cell strings 11'. The memory cell array 10 may include a plurality of bit lines BL1, BL2, ..., BLm-1, and BLm, a plurality of word lines WL1, WL2, ..., WLn-1, and WLn, upper and lower selection lines USL1, USL2, LSL1, and LSL2, and a common source line CSL, where m and n may each independently be integers greater than 1. The plurality of memory cell strings 11 may be formed between the plurality of bit lines BL1, BL2, ..., BLm-1, and BLm and the common source line CSL. The plurality of memory cell strings 11' may constitute a memory cell block 13.

The upper selection lines USL1 and USL2 may be string selection lines SSLs, and the lower selection lines LSL1 and LSL2 may be ground selection lines GSLs. Alternatively, the upper selection lines USL1 and USL2 may be the ground selection lines GSLs and the lower selection lines LSL1 and LSL2 may be the string selection lines.

Each of the memory cell strings 11' may include an upper selection transistor (UST), a lower selection transistor (LST), and a plurality of memory cell transistors MC1, MC2, ..., MCn-1, and MCn. Drain regions of the USTs may be connected to the bit lines BL1, BL2, ..., BLm-1, and BLm, and source regions of the LSTs may be connected to the common source line CSL. The CSL may be a region to which the source regions of the LSTs are commonly connected.

The UST may be connected to the upper selection lines USL1 and USL2, and the LST may be connected to the lower selection lines LSL1 and LSL2. In addition, each of the memory cell transistors MC1, MC2, ..., MCn-1, and MCn may be respectively connected to the word lines WL1, WL2, ..., WLn-1, and WLn.

The memory cell array 10 may be arranged in a three-dimensional structure. The memory cell transistors MC1, MC2, ..., MCn-1, and MCn in the memory cell strings 11' may be connected serially along a z-axis that is perpendicular to an x-y plane that is parallel with an upper surface of a substrate (not shown). Accordingly, the USTs, and LSTs, and channel regions of the memory cell transistors MC1, MC2, ..., MCn-1, and MCn may be substantially perpendicular to the x-y plane. In each of the x-y planes, m memory cells may be provided, and n numbers of the x-y planes may be stacked on the substrate in the z-axis direction. Accordingly, m bit lines BL1, BL2, ..., BLm-1, and BLm may be connected respectively to the cell strings 11' and n word lines WL1, WL2, WLn-1, and WLn may be respectively connected to the memory cells.

Although FIG. 1 illustrates a circuit diagram where each memory cell string 11' includes one upper selection transistor UST connected in series to a plurality of memory cell transistors MC1, MC2, ..., MCn-1, and MCn, and one lower selection transistor LST between the bit lines BL1, BL2, BLm-1, and BLm and common source line CSL, example embodiments of inventive concepts are not limited thereto. For example, FIG. 3 of the present application illustrates a non-volatile memory device including memory cell strings 11 with two upper selection transistors UST1 and UST2 connected in series with memory cells MC1 to MC4 and lower selection transistors LST1 and LST2. Additionally, although not shown, example embodiments of inventive concepts may include memory cell strings having more than 2 upper selection transistor and/or lower selection transistors.

Additionally, although FIG. 1 illustrates a circuit diagram where the upper selection transistor UST and lower selection transistor LST do not include a floating gate, example embodiments of inventive concepts are not limited thereto. The upper selection transistor UST and/or lower selection transistor LST may include a floating gate.

Figure 2:
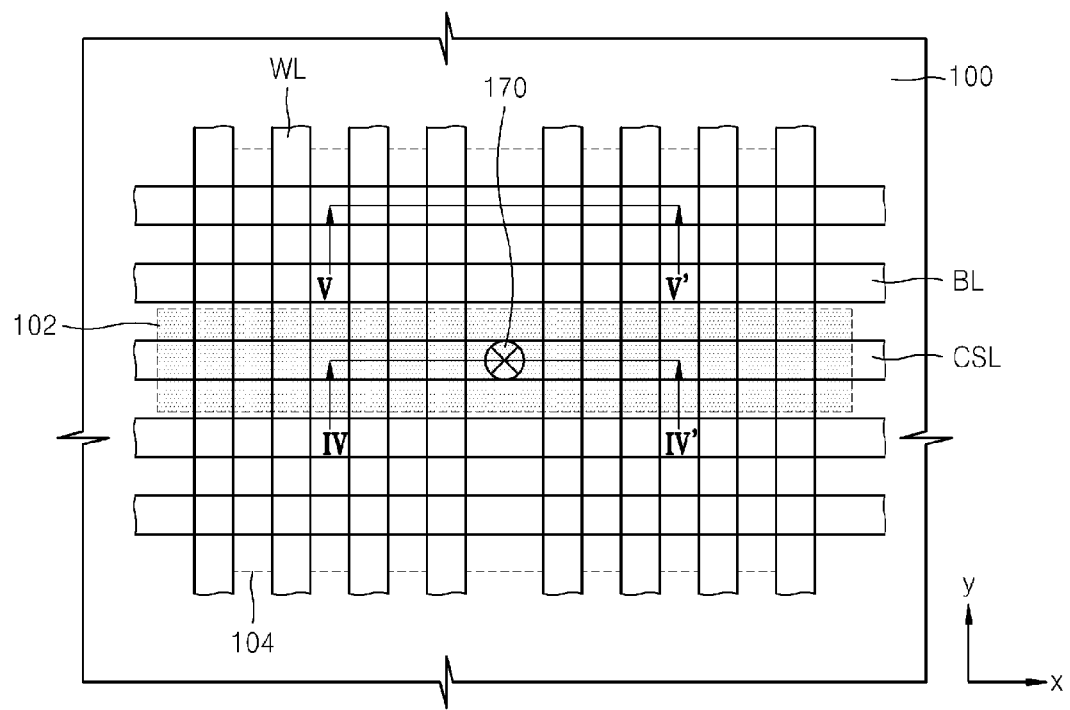
FIG. 2 is a schematic diagram showing a layout of the non-volatile memory device according to example embodiments of inventive concepts.

FIG. 2 is a schematic diagram showing a layout of the non-volatile memory device according to example embodiments of inventive concepts.

Referring to FIG. 2, a plurality of bit lines BL may extend in a first direction (x-axis direction of FIG. 2), and a plurality of word lines WL may extend in a second direction (y-axis direction of FIG. 2) having a desired (and/or alternatively predetermined) angle with respect to the first direction. A common source line CSL may extend along the extending direction of the bit lines BL between the plurality of bit lines BL.

At an upper portion of a substrate 100, common source regions 104 extending in the extending direction of the word lines WL may be formed between the plurality of word lines WL. The common source regions 104 may be first impurity regions of a first conductive type.

A common source line strapping region 102 may be formed to cross the common source regions 104 on the upper portion of the substrate 100, on which the common source line CSL is formed. The common source line strapping region 102 may be a second impurity region having the same conductive type as that of the first conductive type of the common source regions 104. The common source line strapping region 102 may be electrically connected to the common source regions 104.

A contact plug 170 may be formed on the common source line strapping region 102 to electrically connect the common source line strapping region 102 to the common source line CSL. Accordingly, the common source regions 104 may be simultaneously driven by a voltage that is applied to the common source line strapping region 102 via the common source line CSL. Since the common source line strapping region 102 crosses the common source regions 104, the common source line CSL may be in parallel with the extending direction of the bit lines BL.

Figure 3:
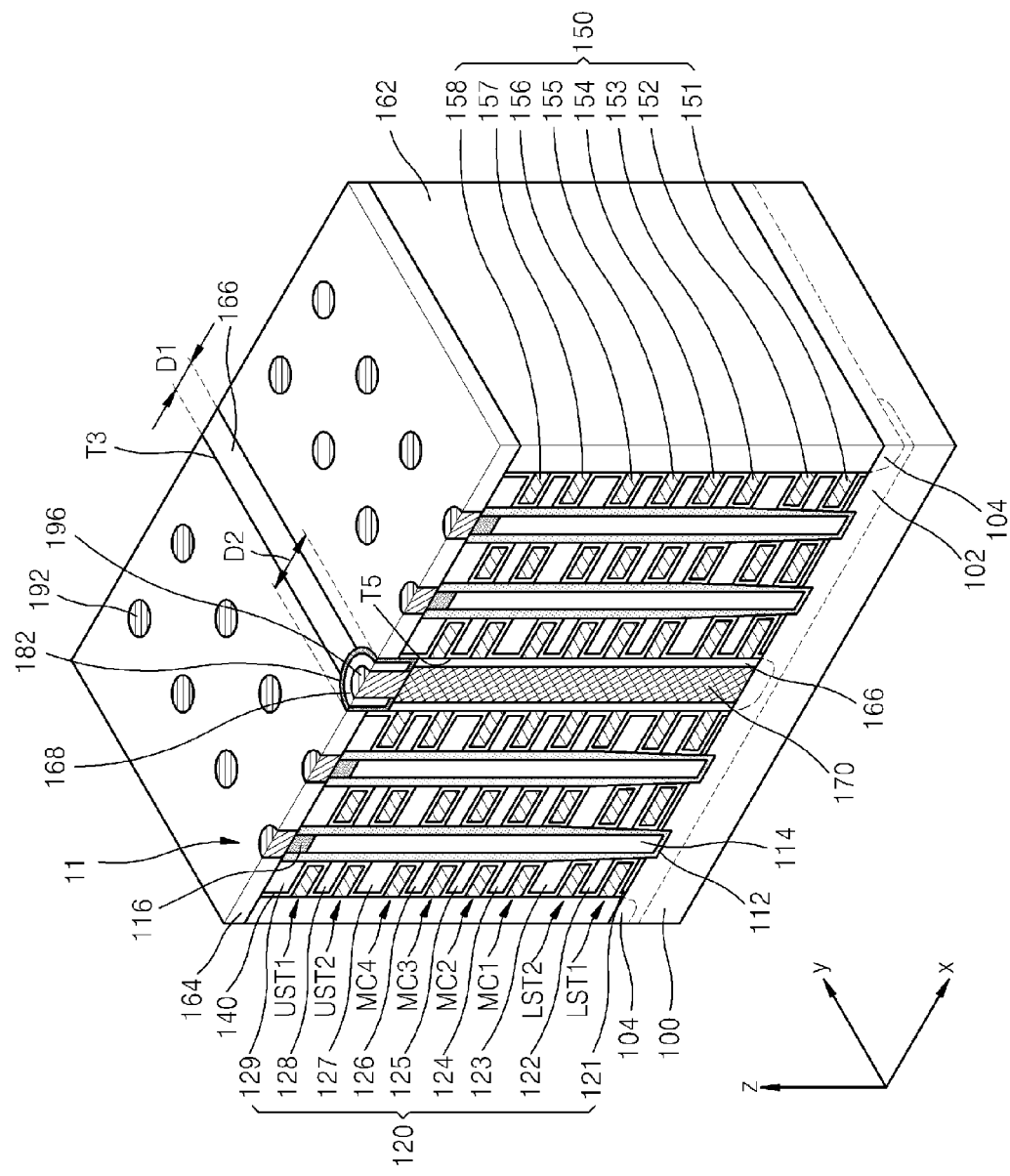
FIG. 3 is a perspective view of the non-volatile memory device according to example embodiments of inventive concepts.
Figure 4A:
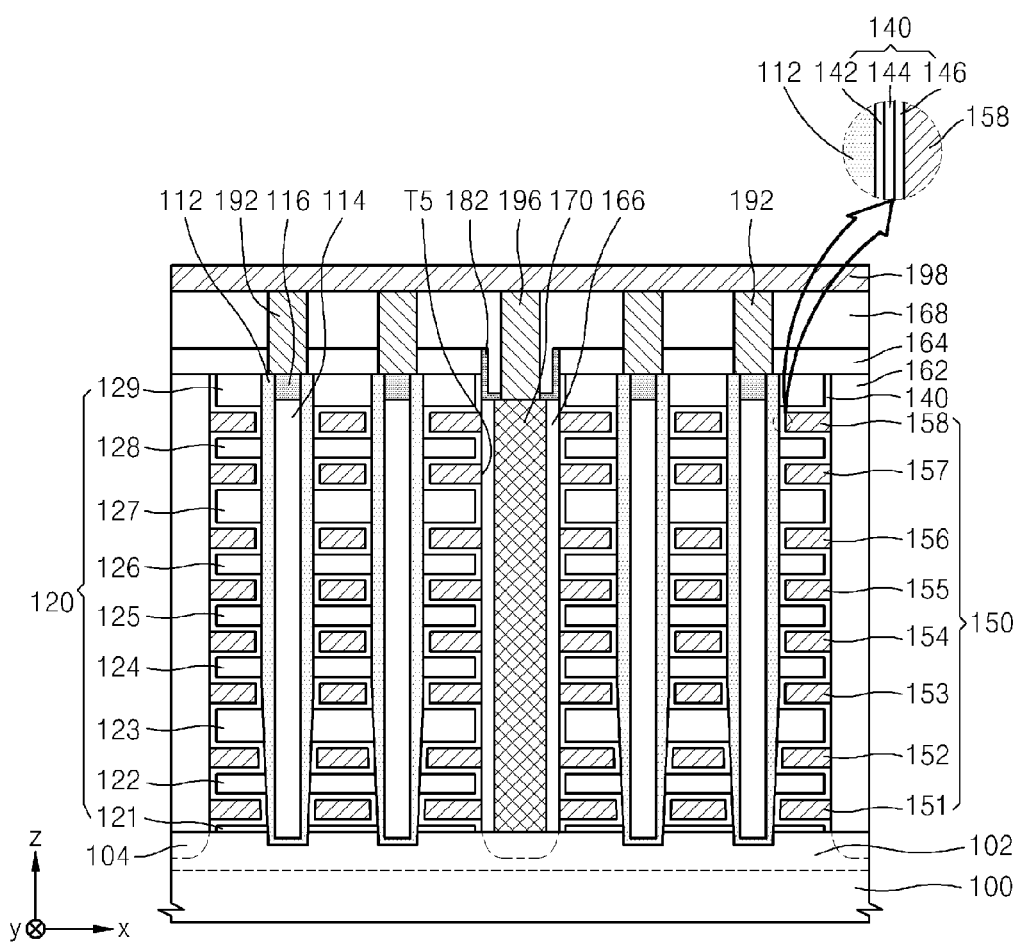
FIGS. 4A and 5A are cross-sectional views of the non-volatile memory device of FIG. 3.
Figure 5A:
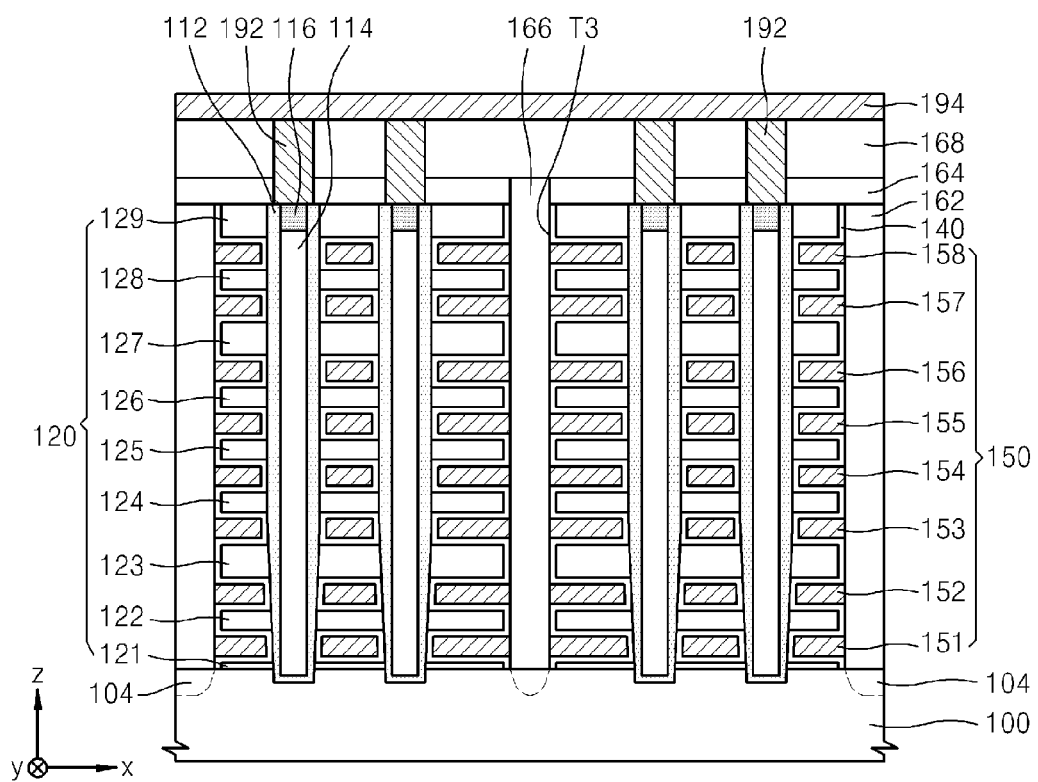

FIG. 3 is a perspective view of a non-volatile memory device according to example embodiments of inventive concepts, and FIGS. 4A and 5A are cross-sectional views of the non-volatile memory device of FIG. 3. FIG. 4A is a cross-sectional view taken along a line IV-IV' of FIG. 2, and FIG. 5A is a cross-sectional view taken along a line V-V' of FIG. 2.

Referring to FIGS. 3, 4A, and 5A, the non-volatile memory device may include a plurality of memory cell strings 11 formed on a substrate 100. Each of the memory cell strings 11 may include a channel region 112, and lower selection transistors LST1 and LST2, a plurality of memory cell transistors MC1 through MC4, and upper selection transistors UST1 and UST2 arranged along a side wall of the channel region 112.

The substrate 100 may be a semiconductor substrate, a silicon substrate, a germanium substrate, a silicon-germanium substrate, or a silicon-on-insulator (SOI) substrate.

The channel region 112 may be formed to extend along a z-axis direction on the substrate 100. A plurality of channel regions 112 may be formed to be separated from each other in an x-axis direction and a y-axis direction. In FIGS. 3, 4A, and 5A, the plurality of channel regions 112 are arranged to be separated at a desired (and/or alternatively predetermined) distance from each other in the x-axis direction and the y-axis direction; however, the plurality of channel regions 112 may be offset in a zig-zag formation along the y-axis direction. The channel region 112 may be a semiconductor pattern including polysilicon doped with impurities or single crystalline silicon doped with impurities. In FIGS. 3, 4A, and 5A, a cylindrical channel region 112 is shown; however, the channel region 112 may be formed as a pillar and the pillar may have a non-cylindrical shape such as a rectangular shape.

An insulating pillar 114 may be formed on an inner wall of the channel region 112. The insulating pillar 114 may include a dielectric material such as silicon oxide, silicon nitride, or silicon oxynitride, but example embodiments of inventive concepts are not limited thereto. As shown in FIGS. 3, 4A, and 5A, an upper surface of the insulating pillar 114 may be located at a level lower than that of an upper surface of the channel region 112. On the other hand, if the channel region 112 is formed as a pillar, the insulating pillar 114 may be omitted.

A conductive layer pattern 116 may be formed on the inner wall of the channel region 112 and on the insulating pillar 114. An upper surface of the conductive layer pattern 116 may be formed at substantially the same level as that of the upper surface of the channel region 112. Alternatively, the upper surface of the conductive layer pattern 116 may protrude from the upper surface of the channel region 112. The conductive layer pattern 116 may be electrically connected to the channel region 112, and may function as a drain region of the string selection transistor (e.g., UST1 in FIG. 3). The conductive layer pattern 116 may include doped polysilicon.

A plurality of gate electrodes 150 (151 through 158) may be arranged along a side wall of the channel region 112 to be separated from the substrate 110 in the z-axis direction. The gate electrodes 150 may be gates of the lower selection transistors LST1 and LST2, the memory cell transistors MC1 through MC4, and the upper selection transistors UST1 and UST2. The gate electrodes 150 may be commonly connected to the adjacent memory cell string 11 that is arranged in the y-axis direction. The gate electrodes 157 and 158 of the upper selection transistors UST1 and UST2 that are commonly connected to the adjacent memory cell string 11 may function as upper selection lines USL1 and USL2 (refer to FIG. 1). The gate electrodes 153 through 156 of the memory cell transistors MC1 through MC4 that are commonly connected to the adjacent memory cell string 11 may function as word lines WL1, WL2, ..., WLn (refer to FIG. 1). The gate electrodes 151 and 152 of the lower selection transistors LST1 and LST2 that are commonly connected to the adjacent memory cell string 11 may function as lower selection lines LSL1 and LSL2 (refer to FIG. 1). According to example embodiments of inventive concepts, the gate electrodes 150 may include a metal such as tungsten, copper, aluminum, titanium, tantalum, or ruthenium, but example embodiments of inventive concepts are not limited thereto. Although not shown in the drawings, a diffusion barrier layer (not shown) may be further formed on side walls of the gate electrodes 150. The diffusion barrier layer may include tungsten nitride, tantalum nitride, or titanium nitride.

A gate dielectric layer 140 may be formed between the channel region 112 and the gate electrodes 150. The gate dielectric layer 140 may include a tunnel insulating layer 142, a charge storage layer 144, and a blocking insulating layer 146 that are sequentially formed on the channel region 112. According to example embodiments of inventive concepts, the tunnel insulating layer 142 may include silicon oxide. The charge storage layer 144 may be a charge trapping layer or a floating gate layer. The charge storage layer 144 may include a quantum dot or nanocrystal. The quantum dot or the nanocrystal may be formed of fine particles of metal or semiconductor. The blocking insulating layer 146 may include a high-k dielectric material having a high dielectric constant.

A plurality of insulating layers 120 (121 through 129) may be arranged between the gate electrodes 150. For example, a first insulating layer 121 may be formed on the substrate 100, the first gate electrode 151 may be formed on the first insulating layer 121, and a second insulating layer 122 may be formed on the first gate electrode 151. The insulating layers 120 may be separated from each other in the z-axis direction, and may extend in the y-axis direction. A side surface of each of the insulating layers 120 may contact the channel region 112. According to example embodiments of inventive concepts, the insulating layers 120 may include a dielectric material such as silicon oxide, silicon oxynitride, or silicon nitride.

In FIGS. 3, 4A, and 5A, the two upper selection transistors UST1 and UST2 having the two gate electrodes 157 and 158 are shown. In this case, lengths of the gate electrodes 157 and 158 may be reduced, and spaces between the insulating layers 120 may be filled without any void. However, the number of the upper selection transistors UST1 and UST2 is not limited thereto. In addition, the two lower selection transistors LST1 and LST2 having the two gate electrodes 151 and 152 are shown; however, less or more lower selection transistors may be formed. In addition, four memory cell transistors MC1 through MC4 are shown; however, less or more memory cell transistors may be arranged according to a capacity of the memory device.

The common source regions 104 may be formed at an upper portion of the substrate 100 adjacent to the gate electrodes 150. The common source regions 104 may extend along the extending direction of the gate electrodes 150. For example, when the gate electrodes 150 extend in the y-axis direction, the common source regions 104 may extend in the y-axis direction on the substrate 100. The common source regions 104 may be first impurity regions including n-type impurities such as phosphorous or arsenic, or p-type impurities such as boron.

The common source line strapping region 102 may extend in a direction crossing the gate electrodes 150 on the substrate 100, and may be electrically connected to the common source regions 104. Accordingly, the common source line strapping region 102 may cross the common source regions 104 on the substrate 100. The common source line strapping region 102 may be a second impurity region having the impurities of the same conductive type as that of the common source regions 104. Since the common source regions 104 are electrically connected to the common source line strapping region 102, the common source regions 104 may be simultaneously driven by the voltage applied to the common source line strapping region 102.

A first insulating pattern 162 filling spaces between the adjacent gate electrodes 150 may be formed on the common source regions 104. The first insulating pattern 162 may extend in the y-axis direction along the extending direction of the gate electrodes 150.

A first insulating interlayer 164 may be formed to cover the first insulating pattern 162, the channel regions 112, the conductive layer pattern 116, and an uppermost insulating layer 159.

An opening T3 exposing the upper surface of the substrate 100 may be formed between the adjacent gate electrodes 150. The opening T3 has a first width D1 along the extending direction of the gate electrodes 150, and may extend in the y-axis direction.

A contact hole T5 exposing the common source line strapping region 102 is formed in the opening T3. The contact hole T5 may have a second width D2, and the second width D2 may be greater than the first width D1 of the opening T3. The contact hole T5 may have various cross-sectional shapes, such as a circular shape, an oval shape, or a polygonal shape.

A spacer (a lateral insulating layer) 166 may be formed on side walls of the opening T3 and the contact hole T5. The spacer 166 may fill the inside of the opening T3, and may be formed only on the side wall of the contact hole T5. Accordingly, the upper surface of the substrate 100 may be exposed through a bottom portion of the contact hole T5. A portion of the spacer 166 filling the opening T3 may have an upper face substantially coplanar with that of the first insulating interlayer 164 while a portion of the spacer 166 on the side wall of the contact hole T5 may have an upper face lower than that of the first insulating interlayer 164.

A contact plug 170 that is electrically connected to the exposed common source line strapping region 102 is formed on the side wall of the spacer 166 in the contact hole T5. According to example embodiments of inventive concepts, an upper surface of the contact plug 170 may be lower than that of the first insulating interlayer 164. For example, since the contact plug 170 does not completely fill in the contact hole T5, the contact plug 170 may not be formed on an upper portion of the side wall of the contact hole T5. According to example embodiments of inventive concepts, the upper surface of the contact plug 170 may be located at substantially the same plane as that of the upper surface of the spacer 166 in the contact hole T5.

An etch stop layer pattern 182 may be formed on an upper portion of the side wall of the contact hole T5, on the first insulating interlayer 164, and the contact plug 170. The etch stop layer pattern 182 may be formed to surround the side wall of the first insulating interlayer 164 that is exposed by the contact hole T5. According to example embodiments of inventive concepts, the etch stop layer pattern 182 may be formed conformally on the spacer 166, the contact plug 170, and the side wall of the contact hole T5 so as to be formed as a cup with an open bottom. The etch stop layer pattern 182 may extend from the upper portion of the contact plug 170 to the upper portion of the side wall of the first insulating interlayer 164. The etch stop layer pattern 182 may be formed only on the side wall of the first insulating interlayer 164, and may not extend to the upper surface of the first insulating interlayer 164. Accordingly, the etch stop layer pattern 182 may not overlap with the gate electrodes 150. According to example embodiments of inventive concepts, the etch stop layer pattern 182 may include silicon nitride or silicon oxynitride. The etch stop layer pattern 182 may include a material having an etch selectivity with the first insulating interlayer 164.

A second insulating interlayer 168 may be formed on the first insulating interlayer 164, the spacer 166, and the etch stop layer pattern 182. The second insulating interlayer 168 may be formed of substantially the same material as the first insulating interlayer 164.

A plurality of first plugs 192 that are electrically connected to the conductive layer pattern 116 and the channel region 112 may be formed to penetrate through the first and second insulating interlayers 164 and 168. In addition, a second plug 196 that is electrically connected to the contact plug 170 may be formed to penetrate through the second insulating interlayer 168 and the etch stop layer pattern 182. The plurality of first plugs 192 and the second plug 196 may include a conductive material such as metal or doped polysilicon. The first plugs 192 may be a bit line plug, and the second plug 196 may be a common source line plug.

A bit line 194 that is connected to the plurality of first plugs 192 may be formed on the second insulating interlayer 168. For example, the bit line 194 may be connected to the plurality of first plugs 192 that are arranged in the x-axis direction while extending in the x-axis direction.

Common source lines 198 that are connected to the second plug 196 may be formed on the second insulating interlayer 168. For example, the common source lines 198 may extend in a direction substantially parallel to the extending direction of the bit line 194.

Since the non-volatile memory device includes the contact plug 170 and the etch stop layer pattern 182 formed on the common source line strapping region 102, the first and second insulating interlayers 164 and 168 may have uniform heights throughout the entire substrate 100. Accordingly, the plurality of first plugs 192 may have uniform depths, and reliability of the non-volatile memory device may be improved.

Figure 4B:
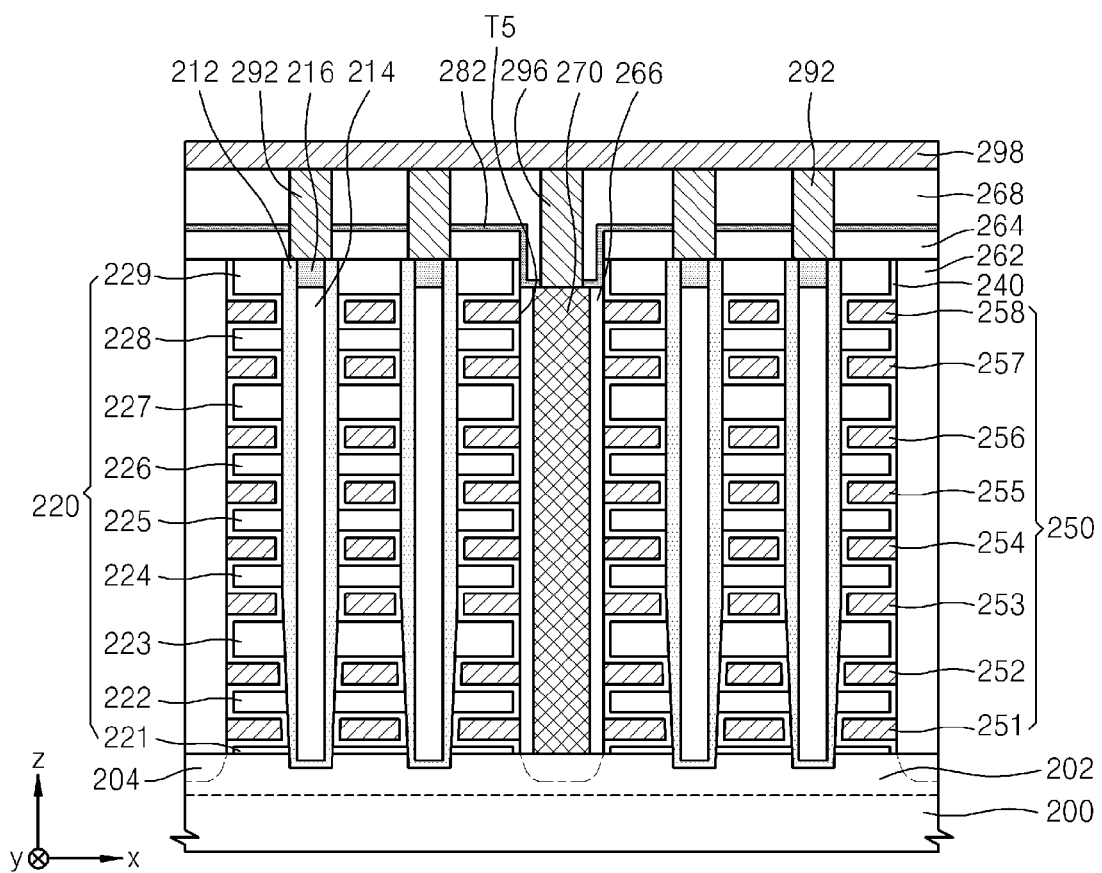
FIGS. 4B and 5B are cross-sectional views of a non-volatile memory device according to example embodiments of inventive concepts.
Figure 5B:
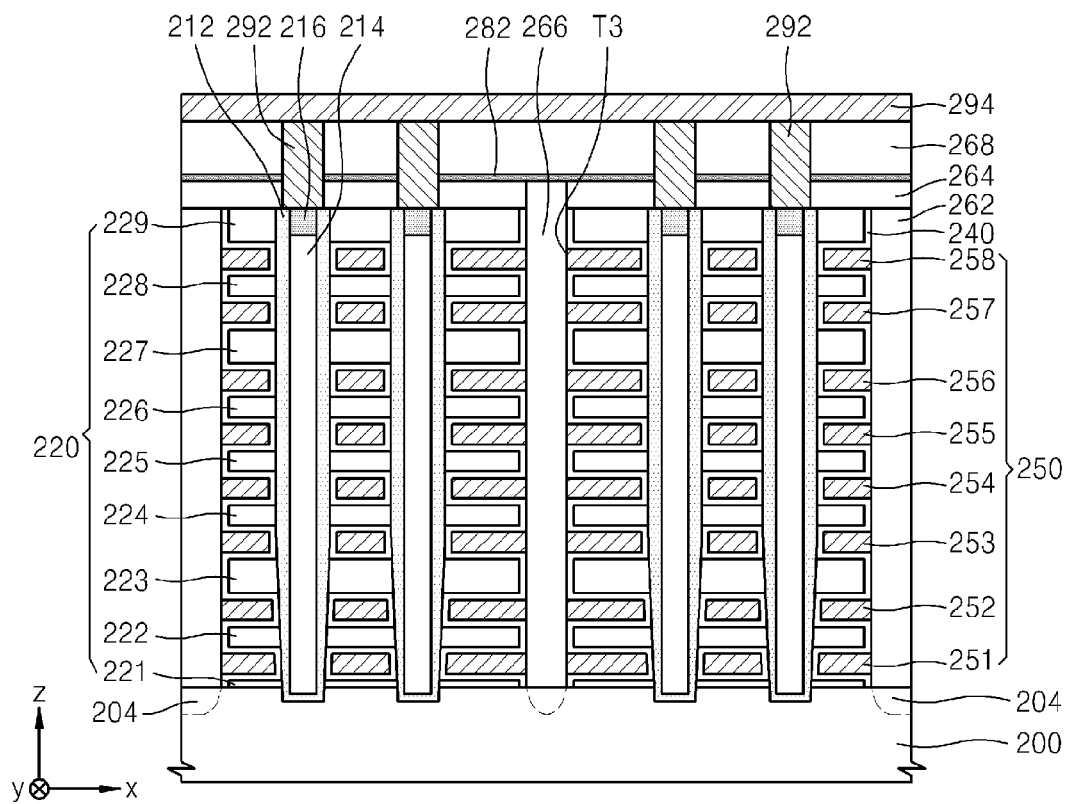

FIGS. 4B and 5B are cross-sectional views of the non-volatile memory device according to example embodiments of inventive concepts. FIG. 4B shows a cross-section taken along the line IV-IV' of FIG. 2, and FIG. 5B shows a cross-section taken along the line V-V' of FIG. 2. The non-volatile memory device is similar to the non-volatile memory device described with reference to FIGS. 3, 4A, and 5A except for a shape of an etch stop layer pattern 282, and thus, only the differences of the non-volatile memory device from that of FIGS. 3, 4A, and 5A will be described below.

Referring to FIG. 4B, a plurality of channel regions 212 that extend in the z-axis direction may be formed on a substrate 200. A plurality of gate electrodes 250 (251 through 258) and insulating layers 220 (221 through 229) may be alternately formed on side walls of the channel regions 212.

Common source regions 204 extending in the extending direction of the gate electrodes 250 may be formed on the substrate 200 between the adjacent gate electrodes 250. A first insulating pattern 262 may be formed on the common source regions 204 to fill spaces between the adjacent gate electrodes 250. In addition, a common source line strapping region 202 that crosses the common source regions 204 may be formed on the substrate 200. A first insulating interlayer 264 may be formed on the channel regions 212, an uppermost insulating layer 229, and the first insulating pattern 262.

An opening T3 extending in the extending direction of the gate electrodes 250 may be formed between the adjacent gate electrodes 250. A contact hole T5 exposing a portion of the common source line strapping region 202 may be formed in the opening T3. A spacer 266 is formed on side walls of the opening T3 and the contact hole T5, and a contact plug 270 is formed on a side wall of the spacer 266 in the contact hole T5. According to example embodiments of inventive concepts, an upper surface of each contact plug 270 may be lower than an upper surface of the first insulating interlayer 264, and accordingly, a side wall of an upper portion of the contact hole T5 may be exposed.

The etch stop layer pattern 282 may be formed on the contact plug 270, the side wall of the upper portion of the contact hole T5, and the first insulating interlayer 264. The etch stop layer pattern 282 may be formed to surround the side wall of the first insulating interlayer 264 that is exposed by the contact hole T5. According to example embodiments of inventive concepts, since the upper surface of the contact plug 270 is lower than the upper surface of the first insulating interlayer 264, the etch stop layer pattern 282 may be conformally formed along the side wall of the upper portion of the contact hole T5. Since the etch stop layer pattern 282 extends from the upper portion of the contact plug 270 to the upper surface of the first insulating interlayer 264, the etch stop layer pattern 282 may overlap with the gate electrodes 250. For example, the etch stop layer pattern 282 may be formed on an entire surface of the first insulating interlayer 264, and may protrude downward from the upper portion of the contact plug 270.

A second insulating interlayer 268 may be formed on the etch stop layer pattern 282.

A plurality of first plugs 292 may be connected to the conductive layer pattern 216 and the channel regions 212 by penetrating through the first and second insulating interlayers 264 and 268 and the etch stop layer pattern 282, and a second plug 296 may be connected to each contact plug 270 by penetrating through the second insulating interlayer 268 and the etch stop layer pattern 282.

A bit line 294 and a common source line 298 extending in the x-axis direction may be formed on the second insulating interlayer 268 to be electrically connected to the first plugs 292 and the second plug 296, respectively.

Since the non-volatile memory device includes the contact plug 270 and the etch stop layer pattern 282 formed on the common source line strapping region 202, the first and second insulating interlayers 264 and 268 may have uniform heights throughout an entire region of the substrate 200. Accordingly, the plurality of first plugs 292 may have uniform depths and reliability of the non-volatile memory device may be improved.

Figure 4C:
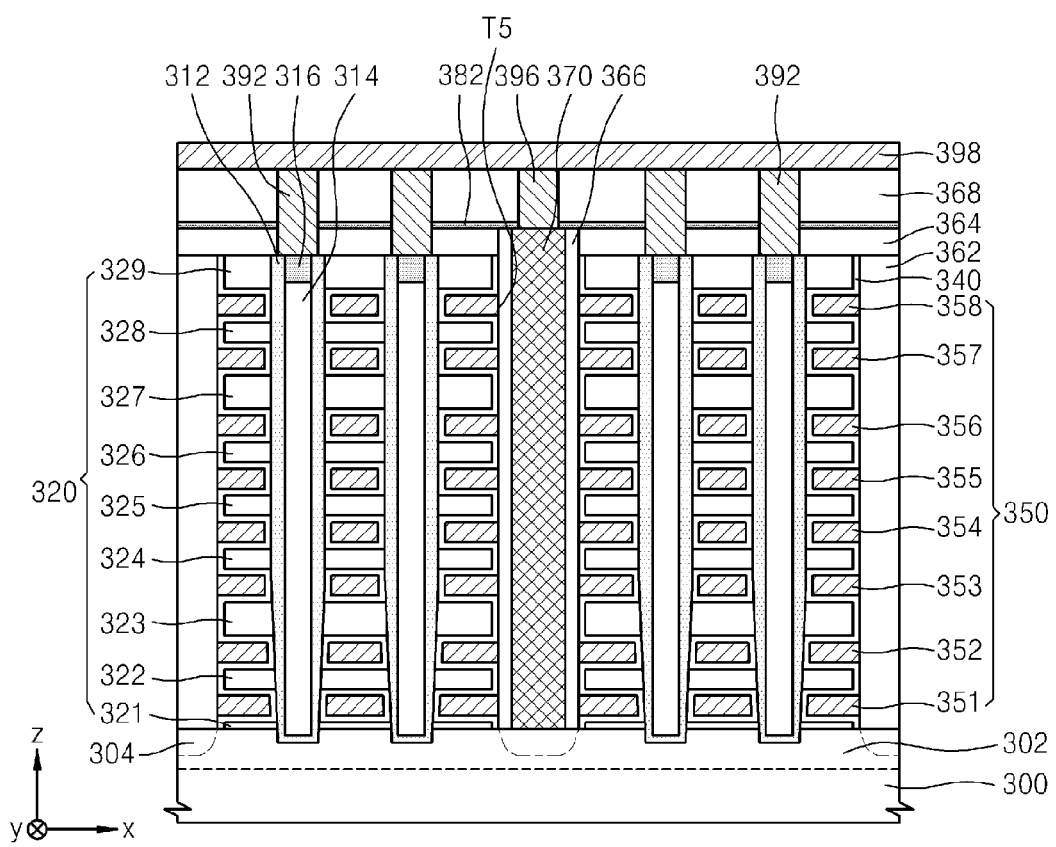
FIGS. 4C and 5C are cross-sectional views of a non-volatile memory device according to example embodiments of inventive concepts.
Figure 5C:
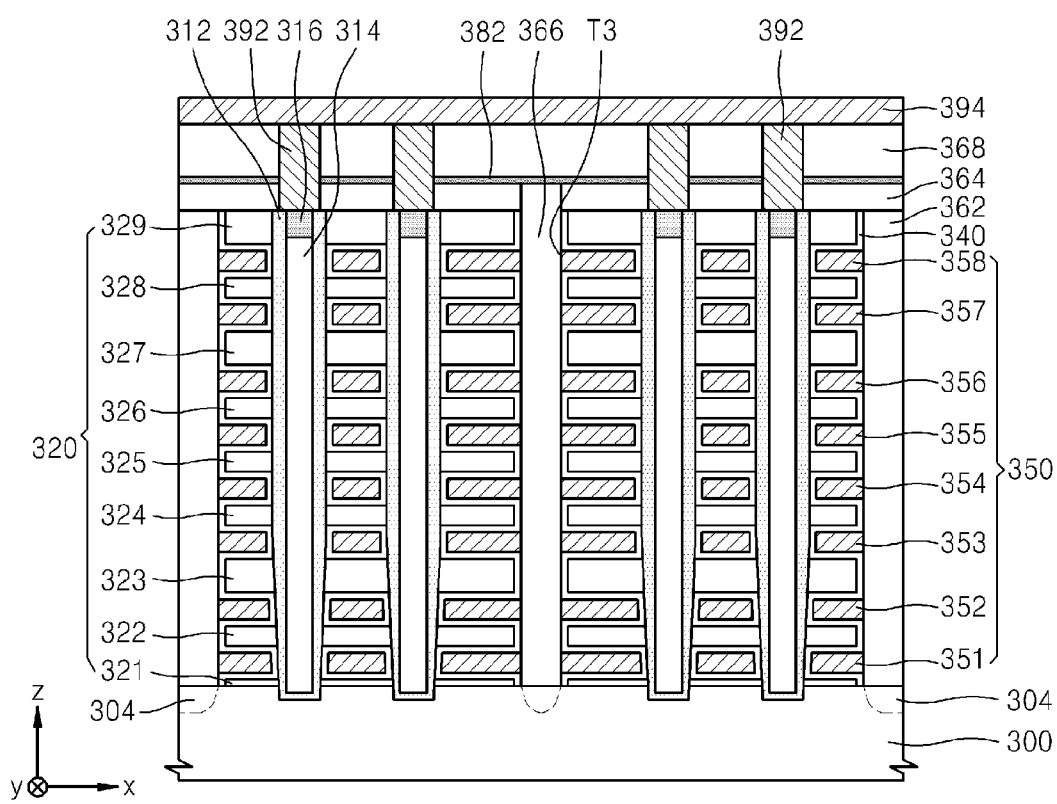

FIGS. 4C and 5C are cross-sectional views of a non-volatile memory device according to example embodiments of inventive concepts. FIG. 4C shows a cross-section taken along the line IV-IV' of FIG. 2, and FIG. 5C shows a cross-section taken along the line V-V' of FIG. 2. The non-volatile memory device is similar to the non-volatile memory device described with reference to FIGS. 3, 4A, and 5A except for a shape of an etch stop layer pattern 382, and thus, only the differences will be described below.

Referring to FIG. 4C, a plurality of channel regions 312 extending in the z-axis direction may be formed on a substrate 300. A plurality of gate electrodes 350 (351 through 358) and insulating layers 320 (321 through 329) may be alternately formed on side walls of the channel regions 312.

Common source regions 304 may be formed on the substrate 300 between the adjacent gate electrodes 350. A first insulating pattern 362 may be formed on the common source regions 304 to fill spaces between the adjacent gate electrodes 350. In addition, a common source line strapping region 302 that crosses the common source regions 304 may be formed on the substrate 300. A first insulating interlayer 364 may be formed on the channel regions 312, an uppermost insulating layer 329, and the first insulating pattern 362.

An opening T3 extending in the extending direction of the gate electrodes 350 may be formed between the adjacent gate electrodes 350. A contact hole T5 exposing some portions of the common source line strapping region 302 may be formed in the openings T3.

A spacer 366 is formed on side walls of the opening T3 and the contact hole T5, and a contact plug 370 is formed on a side wall of the spacer 366 in the contact hole T5. According to example embodiments of inventive concepts, an upper surface of the contact plug 370, may be located at substantially the same level as that of an upper surface of the first insulating interlayer 364. In addition, an upper surface of the spacer 366 may be located at substantially the same level as that of the upper surface of the contact plug 370.

The etch stop layer pattern 382 may be formed on the first insulating interlayer 364, the spacer 366, and each contact plug 370. According to example embodiments of inventive concepts, the contact plug 370 may be formed at substantially the same plane as the first insulating interlayer 364. Accordingly, the etch stop layer pattern 382 may extend from an upper portion of the contact plug 370 onto an entire surface of the first insulating interlayer 364 to be flat, and the etch stop layer pattern 382 may overlap with the gate electrodes 350.

A second insulating interlayer 368 may be formed on the etch stop layer pattern 382.

First plugs 392 may be connected to the conductive layer pattern 316 and the channel regions 312 by penetrating through the first and second insulating interlayers 364 and 368 and the etch stop layer pattern 382, and a second plug 396 may be connected to the contact plug 370 by penetrating through the second insulating interlayer 368 and the etch stop layer pattern 382.

A bit line 394 and a common source line 398 extend in the x-axis direction may be formed on the second insulating interlayer 368 to be electrically connected to the first plugs 392 and the second plug 296, respectively.

Since a non-volatile memory device according to example embodiments of inventive concepts may include the contact plug 370 and the etch stop layer pattern 382 formed on the common source line strapping region 302, the first and second insulating interlayers 364 and 368 may have uniform heights throughout the entire region on the substrate 300. Accordingly, the first plugs 392 may have uniform depths, and reliability of the non-volatile memory device may be improved.

FIGS. 6A through 6K are cross-sectional views illustrating a method of manufacturing a non-volatile memory device according to example embodiments of inventive concepts. The above method may be to manufacture the non-volatile memory device described with reference to FIGS. 3, 4A, and 5A. In addition, FIGS. 6A through 6K are cross-sectional views of the non-volatile memory device taken along the line IV-IV' of FIG. 2.

Figure 6A:
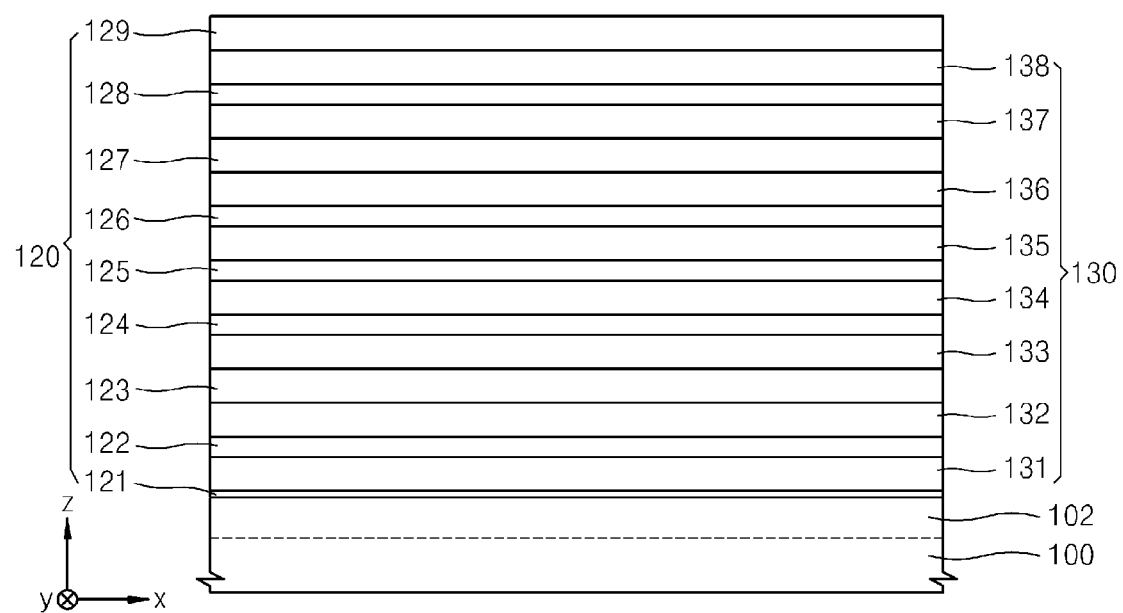
FIGS. 6A through 6K are cross-sectional views illustrating a method of manufacturing the non-volatile memory device according to example embodiments of inventive concepts.

Referring to FIG. 6A, impurities are implanted onto a substrate 100 to form a common source line strapping region 102. The common source line strapping region 102 may extend in a direction (for example, an x-axis direction of FIG. 6A). The impurities may be n-type impurities such as phosphorous or arsenic, or p-type impurities such as boron. Although not shown in FIG. 6A, a well region (not shown) extending in the extending direction of the common source line strapping region 102 may be further formed on the substrate 100, and the well region may have a conductive type that is different from that of the impurities in the common source line strapping region 102.

A plurality of sacrificial layers 130 (131 through 138) and a plurality of insulating layers 120 (121 through 129) are alternately stacked on the substrate 100. For example, a first insulating layer 121 may be formed on the substrate 100, a first sacrificial layer 131 may be formed on the first insulating layer 121, and a second insulating layer 122 may be formed on the first sacrificial layer 131. The number of sacrificial layers 130 and the number of insulating layers 120 may vary depending on the number of memory cell transistors and the number of upper and lower selection transistors that will be formed in a memory cell string. The sacrificial layers 130 may be formed of a material having an etch selectivity with respect to the insulating layers 120. For example, when the insulating layers 120 are formed of silicon oxide, silicon oxynitride, or silicon nitride, the sacrificial layers 130 may be formed of silicon, silicon carbide, silicon oxide, or silicon nitride, which is different from the material forming the insulating layers 120. The plurality of sacrificial layers 130 and the plurality of insulating layers 120 may not need to have the same thickness. For example, a lowermost first insulating layer 121 may be thinner than any other layers.

Figure 6B:
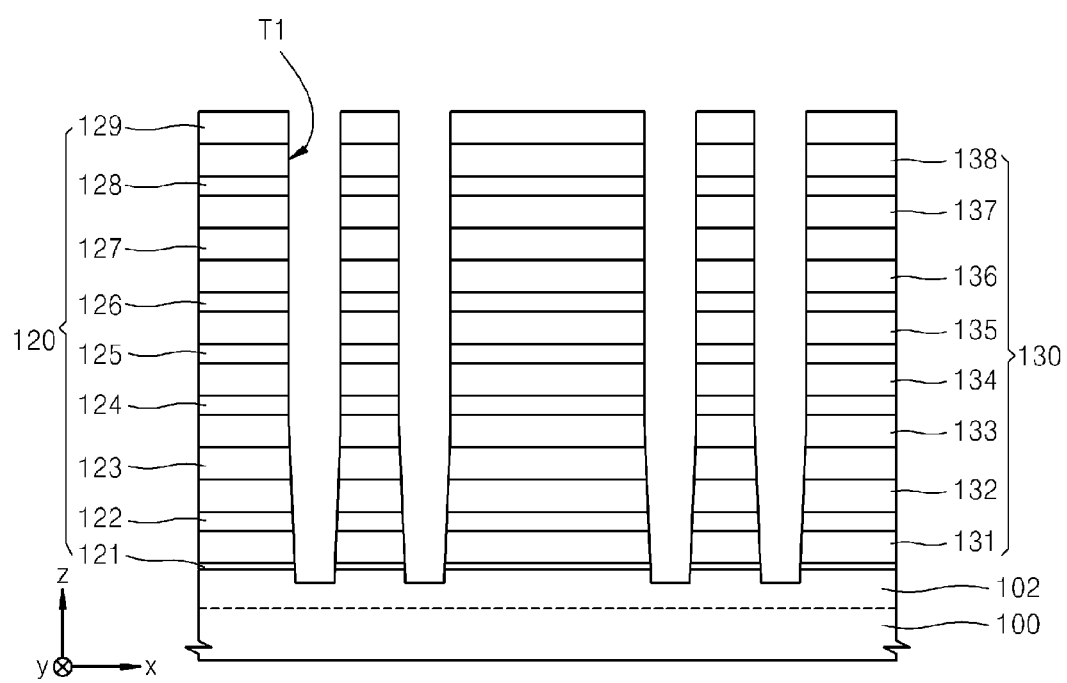

Referring to FIG. 6B, a plurality of first openings T1 may be formed to penetrate through the plurality of sacrificial layers 130 and the plurality of insulating layers 120 that are alternately stacked. A cross-section of the first opening T1 in the z-axis direction may be formed in various shapes, for example, a circular shape, an oval shape, and a polygonal shape. The plurality of the first openings T1 may be separated from each other in the x-axis direction and the y-axis direction.

According to example embodiments of inventive concepts, a mask pattern (not shown) may be formed on the insulating layers 120 and the sacrificial layers 130 that are alternately stacked, and the insulating layers 120 and the sacrificial layers 130 may be anisotropically etched by using the mask pattern as an etching mask until an upper surface of the substrate 100 is exposed to form the first openings T1. The first openings T1 may expose the upper surface of the substrate 100, and a portion of the substrate 100 under the first openings T1 may be further etched to a desired (and/or alternatively predetermined) depth to form recesses in the substrate 100.

Figure 6C:
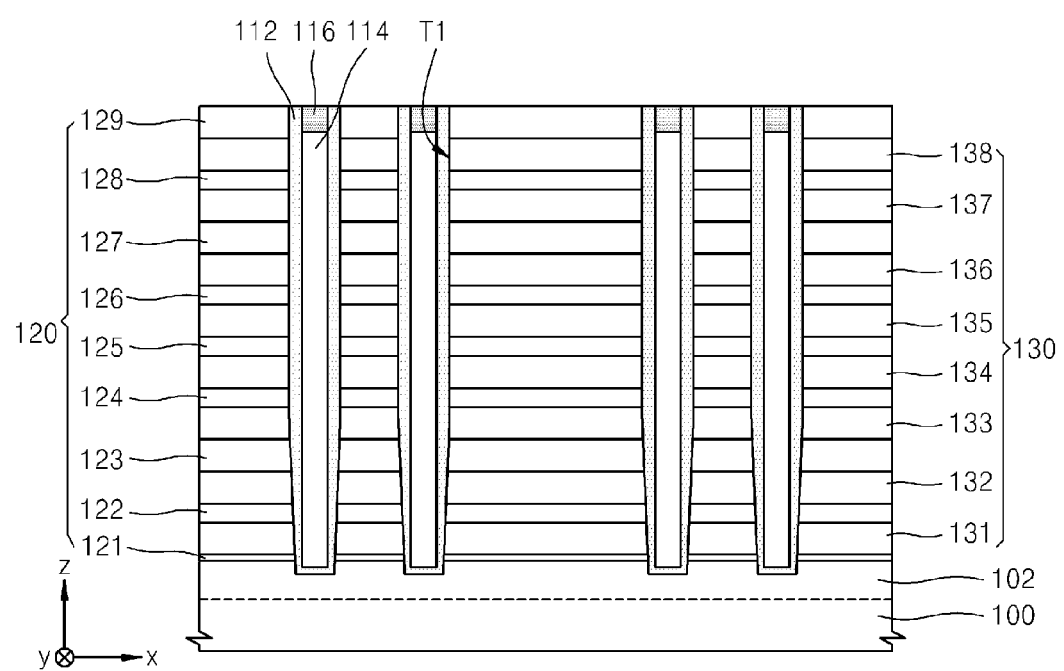

Referring to FIG. 6C, channel regions 112 may be formed on side walls of the first openings T1. The channel regions 112 may be electrically connected to the substrate 100 by directly contacting the substrate 110 at bottom portions of the first openings T1. For example, the channel regions 112 that evenly cover the side walls of the first openings T1 and the upper surface of the substrate 110, which is exposed by the first openings T1, may be formed. According to example embodiments of inventive concepts, the channel regions 112 may be formed using polysilicon doped with impurities by an atomic layer deposition (ALD) process or a chemical vapor deposition (CVD) process.

Then, the first openings T1 may be filled with an insulating pillar 114. The insulating pillar 114 may be formed of an insulating material such as silicon oxide, silicon nitride, or silicon oxynitride. On the other hand, before forming the insulating pillar 114, the structure on which the channel regions 112 are formed may be thermally processed under a gas atmosphere including hydrogen or heavy hydrogen. According to the thermal treatment process, defects existing in the channel regions 112 may be cured.

A planarization process is performed on the insulating pillar 114 so as to remove some upper portion of the insulating pillar 114 in the first openings T1. Accordingly, an upper surface of the insulating pillar 114 may be lower than the upper surfaces of the channel regions 112, and upper portions of the side walls of the channel regions 112 may be exposed. The planarization process may be a chemical mechanical polishing (CMP) process and/or an etching-back process.

A conductive layer pattern 116 may be formed on the insulating pillar 114 and the exposed upper side walls of the channel regions 112. For example, the conductive layer pattern 116 may be formed in the first openings T1 by forming a conductive layer (not shown) filling the first openings T1 on the uppermost insulating layer 129, and planarizing an upper portion of the conductive layer until an upper surface of the uppermost insulating layer 129 is exposed.

Figure 6D:
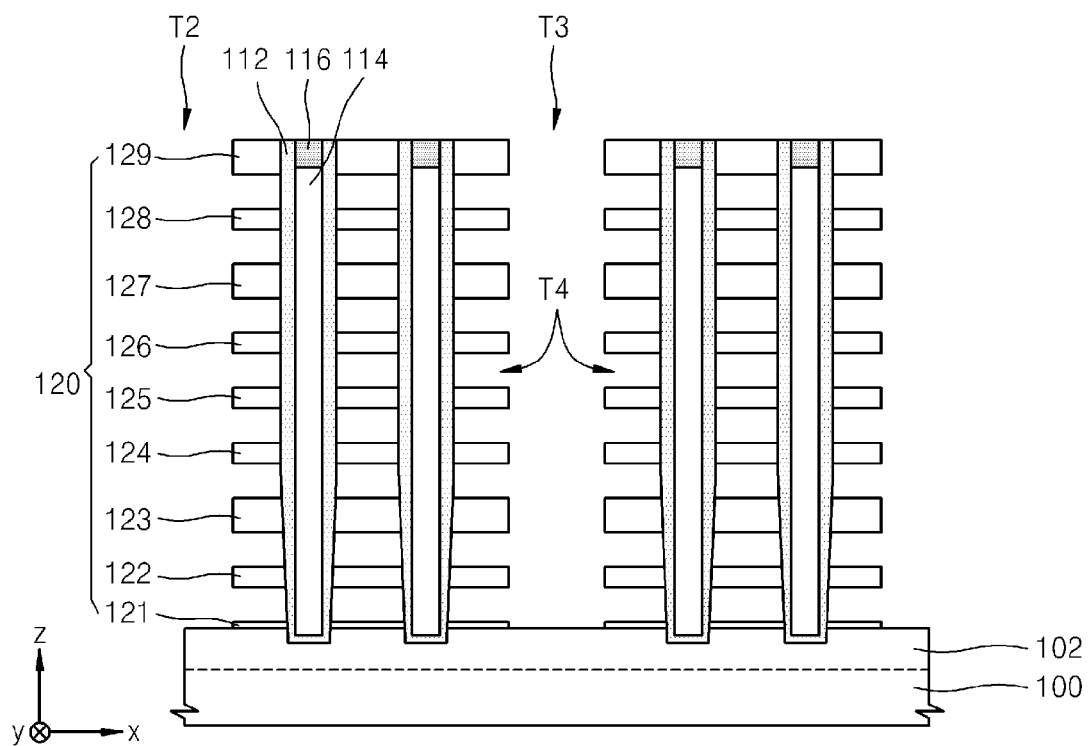

Referring to FIG. 6D, second openings T2 and a third opening T3 exposing the upper surface of the substrate 100 may be formed. The second openings T2 and the third opening T3 may extend in the y-axis direction. The second openings T2 may be formed between adjacent channel regions 112. In FIG. 6D, the plurality of second openings T2 extending in the y-axis direction may be separated from each other in the x-axis direction, and two channel regions 112 are arranged in the x-axis direction between adjacent second openings T2. Alternatively, one channel region 112 may be arranged in the x-axis direction between adjacent second openings T2, or two or more (three or more) channel regions 112 may be formed between the adjacent second openings T2. According to example embodiments of inventive concepts, the second openings T2 and the third opening T3 may be formed by forming a mask pattern (not shown) on the insulating layers 120 and the sacrificial layers 130, and performing an anisotropic etching of the insulating layers 120 and the sacrificial layers 130 by using the mask pattern as an etching mask.

Then, the sacrificial layers 130 exposed by the second openings T2 and the third opening T3 may be removed, and a plurality of side openings T4 that are defined by spaces between the insulating layers 120 and the side walls of the channel regions 112 may be formed. The sacrificial layers 130 may be removed by a wet-etching process. Since the insulating layers 120 are formed of the material having the etch selectivity with respect to the sacrificial layers 130, the insulating layers 120 may not be removed during the removal process of the sacrificial layers 130. Accordingly, the plurality of side openings T4 may be formed between the insulating layers 120.

Figure 6E:
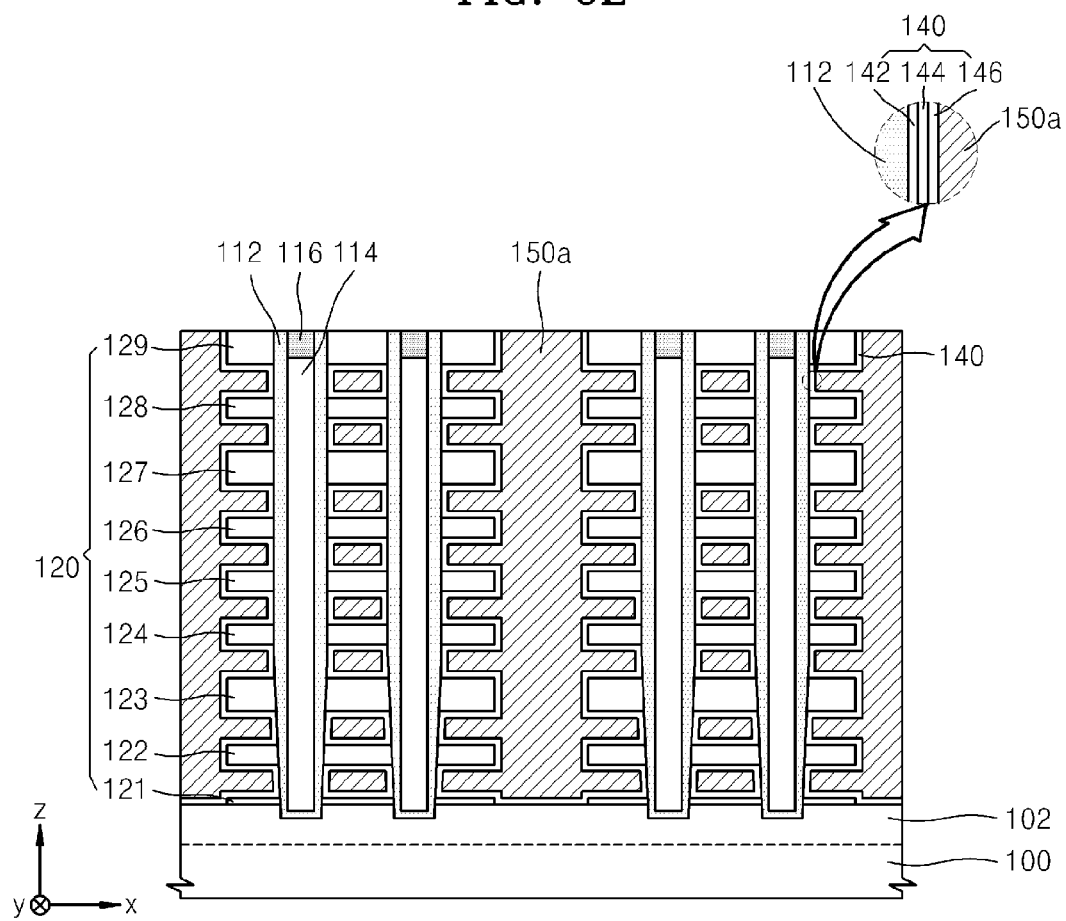

Referring to FIG. 6E, a gate dielectric layer 140 may be formed on the channel regions 112, the insulating layers 120, and the substrate 100, which are exposed by the second and third openings T2 and T3 and the side openings T4. The gate dielectric layer 140 may include a tunnel insulating layer 142, a charge storage layer 144, and a blocking insulating layer 146 that are sequentially stacked on the channel regions 112. According to example embodiments of inventive concepts, the tunnel insulating layer 142, the charge storage layer 144, and the blocking insulating layer 146 may be formed by the ALD process or the CVD process. Also, the tunnel insulating layer 142 may include silicon oxide. The charge storage layer 144 may be a charge trapping layer or a floating gate layer. The charge storage layer 144 may include a quantum dot or nano-crystal. The quantum dot or the nano-crystal may be formed of fine particles of a conductive material, for example, a metal or semiconductor. The blocking insulating layer 146 may be formed of a high-k dielectric material having a high dielectric constant.

A conductive layer 150a may fill the second and third openings T2 and T3 and the side openings T4. According to example embodiments of inventive concepts, the conductive layer 150a may be formed of a metal such as tungsten, copper, aluminum, titanium, tantalum, or ruthenium. For example, the conductive layer 150a may be formed by an electroplating process. On the other hand, a process of forming a diffusion barrier layer (not shown) on the gate dielectric layer 140 may be further performed before forming the conductive layer 150a. The diffusion barrier layer may include tungsten nitride, tantalum nitride, or titanium nitride.

Figure 6F:
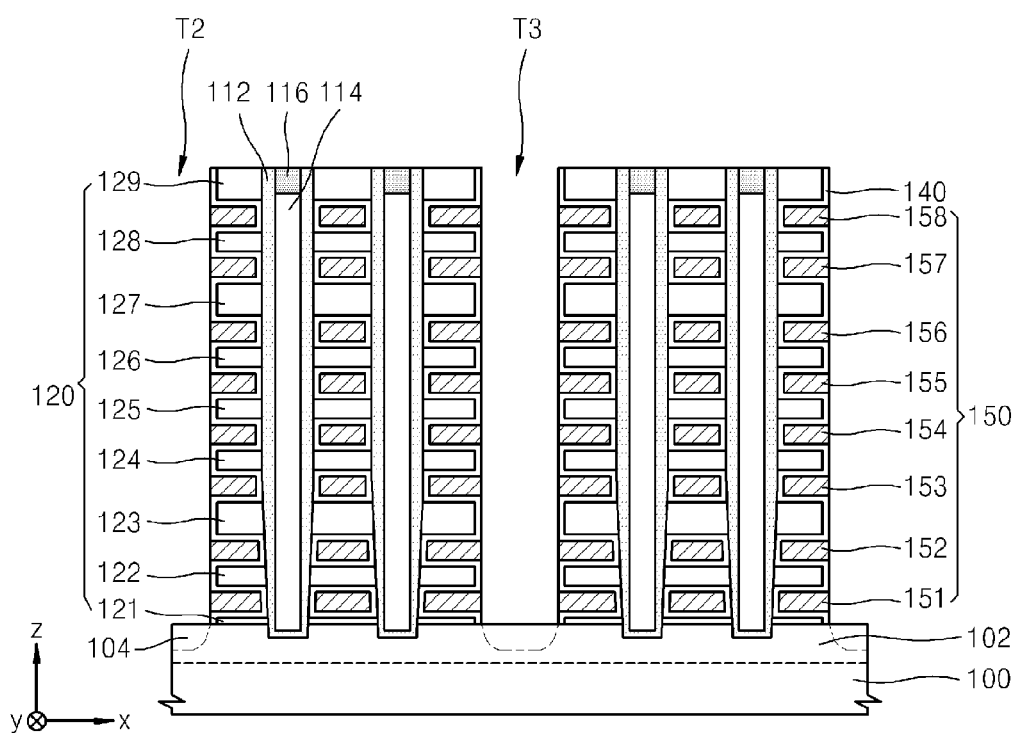

Referring to FIG. 6F, some parts of the conductive layer 150a may be etched to form the second and third openings T2 and T3 again. Accordingly, the conductive layer 150a may fill only in the side openings T4, and thus a plurality of gate electrodes 150 (151 through 158) may be formed between the side openings T4. The conductive layer 150a may be etched by an anisotropic etching process, and the gate dielectric layer 140 formed on the upper surface of the substrate 100 and the channel regions 112 may be removed by the anisotropic etching process.

On the other hand, the second and third openings T2 and T3 may extend in the y-axis direction. The second and third openings T2 and T3 may cross the common source line strapping region 102, and may expose some parts of the common source line strapping region 102. In addition, the third opening T3 may have a width that is greater than that of the second opening T2. A contact plug 170 (refer to FIG. 6H) may be formed in the third opening T3 that cross the common source line strapping region 102 in a subsequent process. According to example embodiments of inventive concepts, the third opening T3 may expand in a circular or an oval shape on the upper portion of the common source line strapping region 102. For example, the third openings T3 may be formed so that a width (D2 of FIG. 3) exposing the common source line strapping 102 may be greater than a width (D1 of FIG. 3) that does not expose the common source line strapping region 102.

After that, impurities are implanted into the substrate 100 that is exposed by the second and third openings T2 and T3 to form the common source regions 104 on the substrate 100. The common source regions 104 may extend in the y-axis direction, and may cross the common source line strapping region 102. The common source regions 104 may have the same conductive type as that of the common source line strapping region 102.

Figure 6G:
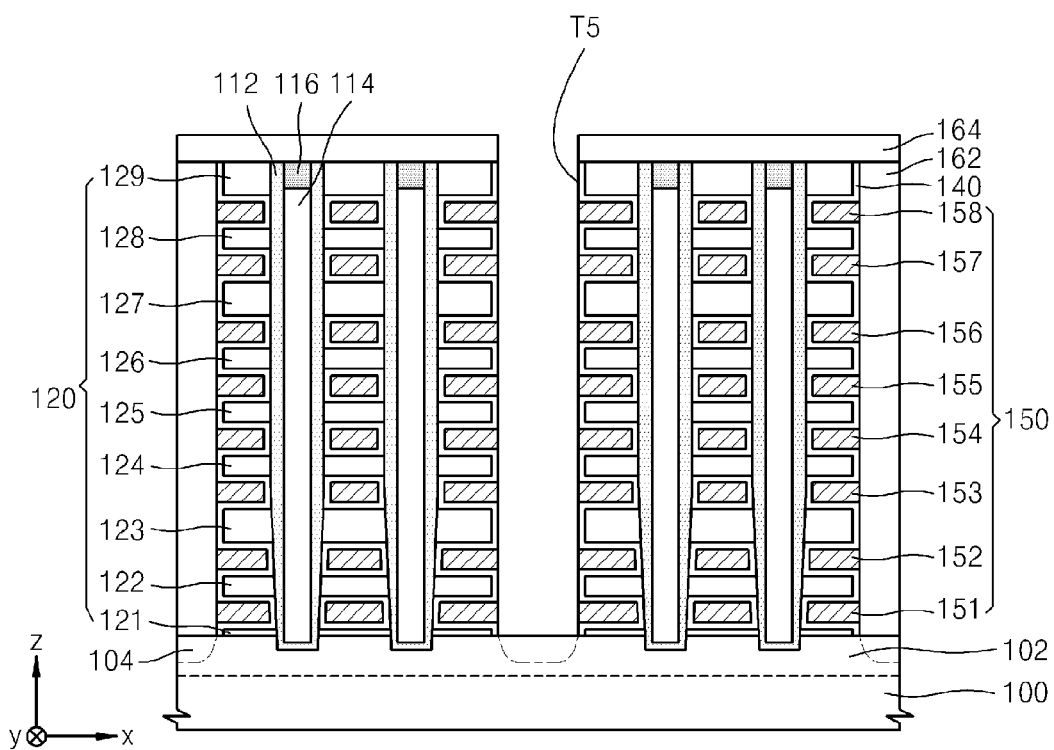

Referring to FIG. 6G, an insulating layer (not shown) filling the second and third openings T2 and T3 may be formed on the substrate 100, and after that, a planarization process of the insulating layer is performed to form the first insulating pattern 162 filling in the second and third openings T2 and T3. According to example embodiments of inventive concepts, the first insulating pattern 162 may be formed of silicon oxide, silicon nitride, or silicon oxynitride.

Then, the first insulating interlayer 164 may be formed on the channel regions 112, the conductive layer pattern 116, the uppermost insulating layer 129, and the first insulating pattern 162. According to example embodiments of inventive concepts, the first insulating interlayer 164 may be formed of silicon oxide, silicon nitride, or silicon oxynitride.

Then, the first insulating pattern 162 and first insulating interlayer 164 covering the third openings T3 may be removed to form contact hole T5 that expose the common source line strapping region 102. According to example embodiments of inventive concepts, an entire portion of the third openings T3 extending in the y-axis direction may be exposed again, and a portion exposing the common source line strapping region 102 in the third opening T3 may be defined as the contact hole T5.

Alternatively, the contact hole T5 exposing the common source line strapping region 102 may be formed by removing the first and second insulating interlayers 162 and 164 on the common source line strapping region 102 in the third openings T3, and then, the first insulating pattern 162 and first insulating interlayer 164 may remain in the third openings T3 where the contact hole T5 are not formed.

Figure 6H:
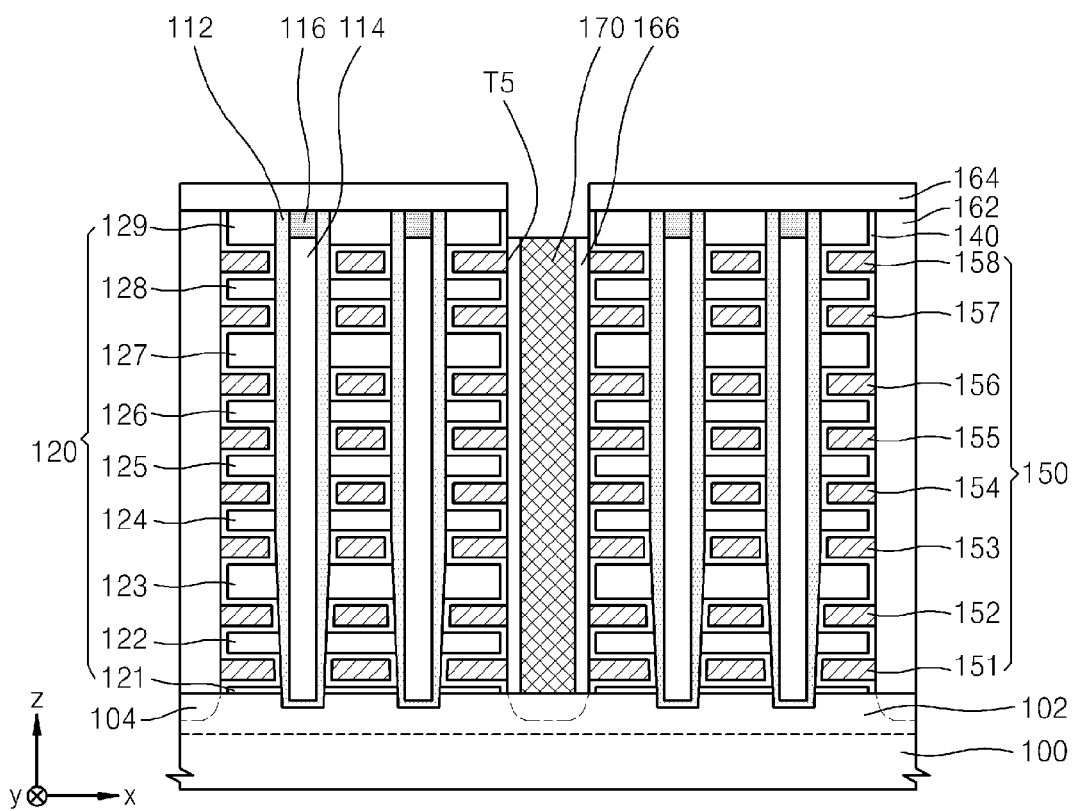

Referring to FIG. 6H, a spacer 166 may be formed on the side wall of each contact hole T5. According to example embodiments of inventive concepts, an insulating layer (not shown) may be formed on an inner wall of contact hole 15, and an anisotropic etching of the insulating layer may be performed to expose the upper surface of the substrate 100 by a bottom portion of the contact hole T5, and the spacer 166 may be formed on the side wall of contact hole T5. On the other hand, during the process of forming the spacer 166 on the side wall of contact hole T5, the spacer 166 may be formed on the side wall of the third opening T3. In addition, since a width (D2 of FIG. 3) of contact hole T5 is greater than a width (D1 of FIG. 3) of the third opening T3, as shown in FIG. 3, the spacer 166 may fill the third openings T3.

After that, a conductive layer (not shown) filling contact hole T5 is formed, and a planarization process of the conductive layer is performed to form a contact plug 170 that is electrically connected to the common source line strapping region 102. According to example embodiments of inventive concepts, the contact plug 170 may be formed by using a metal such as tungsten, copper, titanium, aluminum, ruthenium, or tantalum. On the other hand, during the process of forming the contact plugs 170, the spacer 166 may be also planarized so that the upper surface of the spacer 166 may be located at substantially the same level as that of the upper surface of the contact plug 170. In addition, the upper surface of the contact plug 170 may be lower than the upper surface of the first insulating interlayer 164 so that an upper portion of the side wall in the contact hole T5 may be exposed. In FIG. 6H, the upper surface of contact plug 170 is lower than the upper surface of the first insulating interlayer 164; however, the upper surface of contact plug 170 may be formed at substantially the same level as that of the upper surface of the first insulating interlayer 164.

Figure 6I:
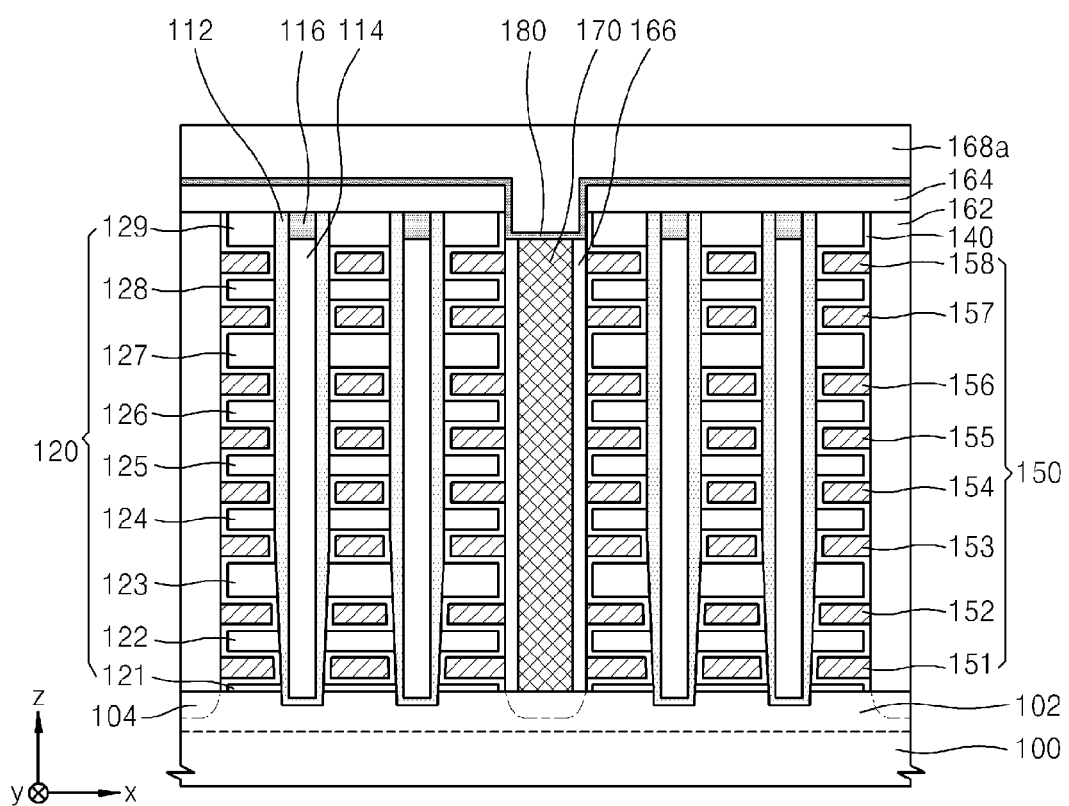

Referring to FIG. 6I, an etch stop layer 180 is formed on the first insulating interlayer 164, the spacer 166, and the contact plugs 170. According to example embodiments of inventive concepts, the etch stop layer 180 may be formed of an insulating material such as silicon nitride, silicon oxynitride, or metal oxide. In addition, the etch stop layer 180 may be formed of a material having an etch selectivity with respect to the first insulating interlayer 164. Since the upper surface of the contact plug 170 is lower than the upper surface of the first insulating interlayer 164, the etch stop layer 180 may be conformally formed on side walls of the spacer 166, the contact plugs 170, and the contact hole T5. In addition, the etch stop layer 180 may extend from the upper portion of the contact plug 170 onto the upper surface of the first insulating interlayer 164, and thus the etch stop layer 180 may overlap with the gate electrodes 150. For example, the etch stop layer 180 may be formed on the entire surface of the first insulating interlayer 164, and may protrude downward from the upper portion of the contact plug 170.

Then, a second insulating interlayer 168a may be formed on the etch stop layer 180. According to example embodiments of inventive concepts, the second insulating interlayer 168a may be formed of a material having an etch selectivity with respect to the etch stop layer 180.

Figure 6J:
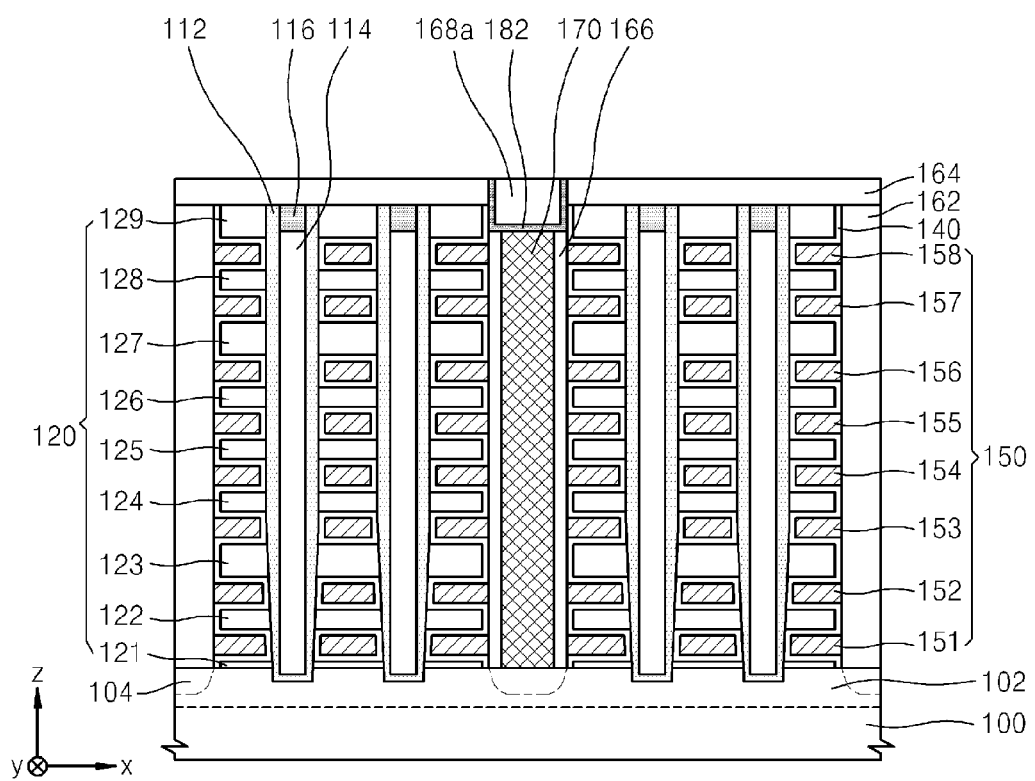

Referring to FIG. 6J, a planarization process of the second insulating interlayer 168a is performed until an upper surface of the etch stop layer 180 is exposed. The planarization process may be a CMP process or an etch-back process. Since the etch stop layer 180 has the etch selectivity with respect to the second insulating interlayer 168a, the etch stop layer 180 may not be removed until the second insulating interlayer 168a is removed completely.

After that, a planarization process of the etch stop layer 180 may be further performed to remove the etch stop layer 180 formed on the first insulating interlayer 164, and the etch stop layer pattern 182 may remain on the contact plugs 170. Accordingly, the etch stop layer pattern 182 may be formed to surround the side wall of the first insulating interlayer 164 that is exposed by the contact hole T5. According to example embodiments of inventive concepts, the etch stop layer pattern 182 extends from the upper portion of the contact plug 170 onto the side wall of the first insulating interlayer 164, and may not overlap with the gate electrodes 150. For example, the etch stop layer pattern 182 may be conformally formed on the contact plug 170 and the side wall of each contact hole T5, and a second plug (196 of FIG. 6K) penetrates through the etch stop layer pattern 182 in a subsequent process so that the etch stop layer pattern 182 may be formed as a cup with an open bottom.

According to example embodiments of inventive concepts, a portion of the etch stop layer 180, which is formed on the first insulating interlayer 164, may not be removed. Accordingly, the etch stop layer pattern 182 extends from the upper portion of the contact plug 170 onto the upper surface of the first insulating interlayer 164, and the etch stop layer pattern 182 may overlap with the gate electrodes 150. For example, the etch stop layer pattern 182 may be formed on an entire surface of the first insulating interlayer 164, and may protrude downward from the upper portion of the contact plug 170. In this case, the non-volatile memory device described with reference to FIGS. 4B and 5B may be manufactured.

According to example embodiments of inventive concepts, the upper surface of the contact plug 170 may be formed at substantially the same plane as that of the upper surface of the first insulating interlayer 164. Accordingly, the etch stop layer 182 may evenly extend onto the contact plug 170 and the first insulating interlayer 164. The etch stop layer pattern 182 may overlap with the gate electrodes 150. In this case, the non-volatile memory device described with reference to FIGS. 5B and 5C may be manufactured.

Figure 6K:
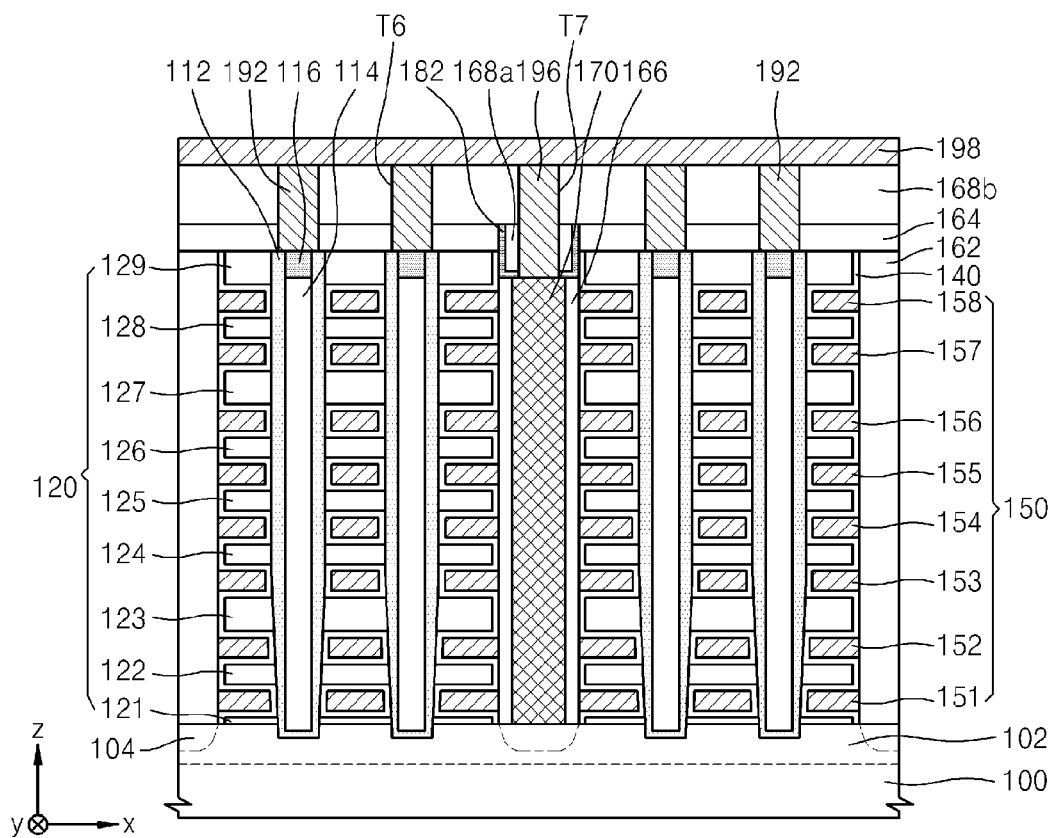

Referring to FIG. 6K, a third insulating interlayer 168b is formed on the first insulating interlayer 164, the etch stop layer pattern 182, and the second insulating interlayer 168a.

After that, fifth openings T6 may be formed through the first and third insulating interlayers 164 and 168b to expose the conductive layer pattern 116 and the channel regions 112, and sixth openings T7 may be formed through the second and third insulating interlayers 168a and 168b to expose the contact plug 170.

A conductive layer (not shown) filling the fifth and sixth openings T6 and T7 may be formed on the third insulating interlayer 168b, and the conductive layer may be planarized to form first plugs 192 and a second plug 196, which are connected to the conductive layer pattern 116 and the channel regions 112, and the contact plug 170, respectively.

After that, a conductive layer (not shown) is formed on the third insulating interlayer 168b, and the conductive layer is patterned to form the bit line (194 of FIG. 5A) and the common source line 198 that are electrically connected respectively to the first and second plugs 192 and 196. The bit line 194 may extend in the x-axis direction to be connected to the plurality of first plugs 192 that are separated from each other in the x-axis direction.

Through the above described processes, a non-volatile memory device may be manufactured. In the non-volatile memory device, the etch stop layer pattern 182 is formed on the contact plug 170 that are connected to the common source line strapping region 102, and then the insulating interlayers 164 and 168a are planarized. Accordingly, the first and third insulating interlayers 164 and 168b have uniform heights throughout the entire region on the substrate 100. Therefore, the depths of the first plugs 192 may be uniform during the etching process for forming the first plugs 192, and reliability of the non-volatile memory device may be improved.

While some example embodiments have been particularly shown and described, it will be understood by one of ordinary skill in the art that variations in form and detail may be made therein without departing from the spirit and scope of the claims.

What is claimed is:

1. A non-volatile memory device comprising:
a substrate including a first impurity region and a second impurity region,
the second impurity region crossing the first impurity region;
channel regions extending in a vertical direction on the substrate;
gate electrodes separated from each other in the vertical direction and a horizontal direction along outer walls of the channel regions;
a first insulating interlayer on the gate electrodes and the channel regions,
the first insulating interlayer defining a contact hole between at least one adjacent pair of the gate electrodes;
a contact plug in the contact hole of the first insulating interlayer,
the contact plug being electrically connected to the second impurity region; and
an etch stop layer pattern on the contact plug and contacting the first insulating interlayer.

2. The non-volatile memory device of claim 1, wherein the etch stop layer pattern contacts a side wall of the first insulating interlayer that is exposed by the contact hole.

3. The non-volatile memory device of claim 1, wherein an upper surface of the contact plug is lower than an upper surface of the first insulating interlayer.

4. The non-volatile memory device of claim 1, wherein
the etch stop layer pattern extends from an upper portion of the contact plug onto a side wall of the first insulating interlayer, and
the etch stop layer pattern does not overlap the gate electrodes.

5. The non-volatile memory device of claim 1, wherein a shape of the etch stop layer pattern is as a cup with an open bottom.

6. The non-volatile memory device of claim 1, wherein
the etch stop layer pattern extends from an upper portion of the contact plug onto an upper surface of the first insulating interlayer, and
the etch stop layer pattern overlaps at least one of the gate electrodes.

7. The non-volatile memory device of claim 1, wherein
the etch stop layer pattern is on an entire upper surface of the first insulating interlayer, and
the etch stop layer pattern extends downward to an upper portion of the contact plug.

8. The non-volatile memory device of claim 1, further comprising:
a second insulating interlayer on the etch stop layer pattern and the first insulating interlayer;
first plugs electrically connected to the channel regions by penetrating through at least one of the first insulating interlayers, the etch stop layer pattern, and the second insulating interlayer;
a second plug electrically connected to the contact plug by penetrating through the second insulating interlayer;
a bit line on the second insulating interlayer,
the bit line electrically connected to the first plugs; and
a common source line on the second insulating interlayer,
the common source line electrically connected to the second plug.

9. The non-volatile memory device of claim 8, wherein a material of the etch stop layer pattern has an etch selectivity with respect to a material of the second insulating interlayer.

10. The non-volatile memory device of claim 8, wherein the second plug penetrates through the etch stop layer pattern and the second insulating interlayer.

11. The non-volatile memory device of claim 1, wherein an upper surface of the contact plug is coplanar with an upper surface of the first insulating interlayer.

12. The non-volatile memory device of claim 11, wherein the etch stop layer pattern is on the contact plug and an entire surface of the first insulating interlayer, and the etch stop layer pattern overlaps with at least one of the gate electrodes.

13. A non-volatile memory device comprising:
a substrate including a common source region and a common source line strapping region,
    the common source line strapping region crossing the common source region;
channel regions extending in a vertical direction on the substrate;
gate electrodes separated from each other in the vertical direction and a horizontal direction along outer walls of the channel regions;
a first insulating interlayer on the gate electrodes and the channel regions,
    the first insulating interlayer defining a contact hole that exposes a portion of the common source line strapping region between at least one adjacent pair of the gate electrodes;
a contact plug in the contact hole,
    the contact plug electrically connected to the common source line strapping region;
an etch stop layer pattern on the contact plug,
    the etch stop layer pattern contacting a part of the first insulating interlayer; and
a second insulating interlayer on the first insulating interlayer and the etch stop layer pattern.

14. The non-volatile memory device of claim 13, wherein the etch stop layer pattern contacts a side wall of the first insulating interlayer that is exposed by the contact hole.

15. The non-volatile memory device of claim 13, wherein the etch stop layer pattern extends from an upper portion of the contact plug onto an upper surface of the first insulating interlayer, and
the etch stop layer pattern overlaps with at least one of the gate electrodes.

16. A non-volatile memory device comprising:
a substrate including a common source line strapping region intersecting at least one common source region;
a plurality of memory strings extending vertically on the substrate;
a contact plug between at least two of the plurality of memory strings,
    the contact plug on the common source line strapping region;
a first insulating interlayer on the plurality of memory strings,
    the first insulating interlayer defining a contact hole that exposes the contact plug; and
an etch stop layer pattern in the contact hole and on the contact plug.

17. The non-volatile memory device of claim 16, further comprising:
a plurality of bit lines; and
a common source line;
wherein each of the plurality of memory strings is electrically connected to the common source line and one of the plurality of bit lines;
wherein each of the plurality of memory strings includes,
    a channel region extending vertically on the substrate,
    a plurality of gate electrodes spaced apart vertically on the substrate along at least one sidewall of the channel region, and
    a gate dielectric layer between the plurality of gate electrodes and the channel region; and
wherein the contact plug is between the plurality of gate electrodes of the at least two of the plurality of memory strings.

18. The non-volatile memory device of claim 16, further comprising:
a spacer layer between the contact plug and the at least two of the plurality of memory strings,
wherein the etch stop layer is on at least one of the spacer layer and the first insulating interlayer.

19. The non-volatile memory device of claim 16, further comprising:
a second insulating interlayer on the first insulating interlayer,
wherein the etch stop layer pattern extends between the first insulating interlayer and the second insulating interlayer.

20. The non-volatile memory device of claim 16, further comprising:
a common source line;
a plurality of bit lines; and
a second insulating interlayer on the first insulating interlayer, wherein
each of the plurality of memory strings is electrically connected to the common source line and one of the plurality of bit lines, and
the etch stop layer pattern contacts at least one of an upper surface of the first insulating interlayer and a sidewall of the first insulating interlayer.

* * * * *